United States Patent
Iwasaki

(10) Patent No.: US 7,489,027 B2
(45) Date of Patent: Feb. 10, 2009

(54) ACCESSIBLE ELECTRONIC STORAGE APPARATUS

(75) Inventor: Hiroshi Iwasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/007,034

(22) Filed: Jan. 4, 2008

(65) Prior Publication Data

US 2008/0151486 A1 Jun. 26, 2008

Related U.S. Application Data

(60) Continuation of application No. 11/346,314, filed on Feb. 3, 2006, now Pat. No. 7,411,284, which is a continuation of application No. 10/640,038, filed on Aug. 14, 2003, now Pat. No. 7,019,392, which is a division of application No. 09/275,815, filed on Mar. 25, 1999, now Pat. No. 6,642,611.

(30) Foreign Application Priority Data

Mar. 26, 1998 (JP) ............................. P10-079574

(51) Int. Cl.
*H01L 23/02* (2006.01)
*H01L 23/48* (2006.01)

(52) U.S. Cl. .............................. 257/679; 257/E23.064; 257/E23.125; 257/E23.061; 257/E23.124; 257/E21.504; 257/680; 257/380; 257/382; 257/396; 257/390; 257/209; 257/415; 257/315; 235/380; 235/382; 235/487; 235/488; 235/492

(58) Field of Classification Search ................. 257/679, 257/E23.064, E23.125, 396, 390, 315, 680, 257/380, 382, E23.061, E23.124, E21.504, 257/209, 415, 488, 391; 235/488, 492, 380, 235/382, 487, 486; 365/52, 51, 63; 361/395, 361/401, 752, 212, 390, 391, 399
See application file for complete search history.

(56) References Cited

U.S. PATENT DOCUMENTS 3,932,016 A 1/1976 Ammenheuser (Continued)

FOREIGN PATENT DOCUMENTS

| JP | 1-128884 | 5/1989 |
| JP | 10-006670 | 1/1998 |
| JP | 11-214611 | 8/1999 |

\* cited by examiner

*Primary Examiner*—Alexander O Williams
(74) *Attorney, Agent, or Firm*—Finnegan, Henderson, Farabow, Garrett & Dunner, L.L.P.

(57) ABSTRACT

A storage apparatus 10 is disclosed, that comprises a wiring substrate 11 having a first surface and a second surface, a flat type external connection terminal 12a disposed on the first surface of the wiring substrate 11, a semiconductor device 14 disposed on the second surface of the wiring substrate 11 and having a connection terminal 14a connected to the flat type external connection terminal 12a, a molding resin 15 for coating the semiconductor device 14 on the second surface of the wiring substrate 11, a card type supporting frame 10a having a concave portion or a hole portion fitting the wiring substrate 11, the semiconductor device 14, and the molding resin 15 in such a manner that the flat type external connection terminal 12a is exposed to the first surface of the wiring substrate 11, and adhesive resin a adhering integrally the flat type external connection terminal 12a, the wiring substrate 11, the semiconductor device 14, the molding resin 15, and the card type supporting frame 10a. In addition, the storage apparatus 10 can be combined with a card type supporting means 21 that supports detachably with the flat type external connection terminal 12a exposed to one of the surfaces so as to be used as a card type storage apparatus 20 having bigger size.

8 Claims, 19 Drawing Sheets

U.S. PATENT DOCUMENTS

| | | |
|---|---|---|
| 4,703,420 A | 10/1987 | Irwin |
| 4,837,628 A | 6/1989 | Sasaki |
| 4,882,702 A | 11/1989 | Struger et al. |
| 4,980,856 A | 12/1990 | Ueno |
| 5,018,017 A | 5/1991 | Sasaki et al. |
| 5,036,429 A | 7/1991 | Kaneda et al. |
| 5,155,663 A | 10/1992 | Harase |
| 5,172,338 A | 12/1992 | Mehrotra et al. |
| 5,184,282 A | 2/1993 | Kaneda et al. |
| 5,293,236 A | 3/1994 | Adachi et al. |
| 5,300,808 A | 4/1994 | Suppelsa et al. |
| 5,343,319 A | 8/1994 | Moore |
| 5,406,699 A | 4/1995 | Oyama |
| 5,430,859 A | 7/1995 | Norman et al. |
| 5,438,359 A | 8/1995 | Aoki |
| 5,444,664 A | 8/1995 | Kuroda et al. |
| 5,457,590 A | 10/1995 | Barrett et al. |
| 5,475,441 A | 12/1995 | Parulski et al. |
| 5,488,433 A | 1/1996 | Washino et al. |
| 5,550,709 A | 8/1996 | Iwasaki |
| 5,583,370 A | 12/1996 | Higgins, III et al. |
| 5,584,043 A | 12/1996 | Burkart |
| 5,611,057 A | 3/1997 | Pecone et al. |
| 5,612,576 A | 3/1997 | Wilson et al. |
| 5,615,344 A | 3/1997 | Corder |
| 5,671,229 A | 9/1997 | Harari et al. |
| 5,818,102 A | 10/1998 | Rostoker |
| 5,856,662 A | 1/1999 | Kohama et al. |
| 5,866,950 A | 2/1999 | Iwasaki et al. |
| 5,887,145 A | 3/1999 | Harari et al. |
| 5,929,512 A | 7/1999 | Jacobs |
| 6,002,605 A | 12/1999 | Iwasaki et al. |
| 6,054,774 A | 4/2000 | Ohmori et al. |
| 6,072,980 A | 6/2000 | Manico et al. |
| 6,081,452 A | 6/2000 | Ohta |
| 6,137,710 A | 10/2000 | Iwasaki et al. |
| 6,141,210 A | 10/2000 | Iwasaki |
| 6,145,023 A | 11/2000 | Iwasaki |
| 6,147,860 A | 11/2000 | Iwasaki |
| 6,181,598 B1 | 1/2001 | Matsubara et al. |
| 6,229,227 B1 | 5/2001 | Muthukumaraswamy et al. |
| 6,281,450 B1 | 8/2001 | Urasaki et al. |
| 6,292,850 B1 | 9/2001 | Iwasaki |
| 6,471,130 B2 | 10/2002 | Iwasaki |
| 2007/0228536 A1* | 10/2007 | Aoki ........................ 257/678 |

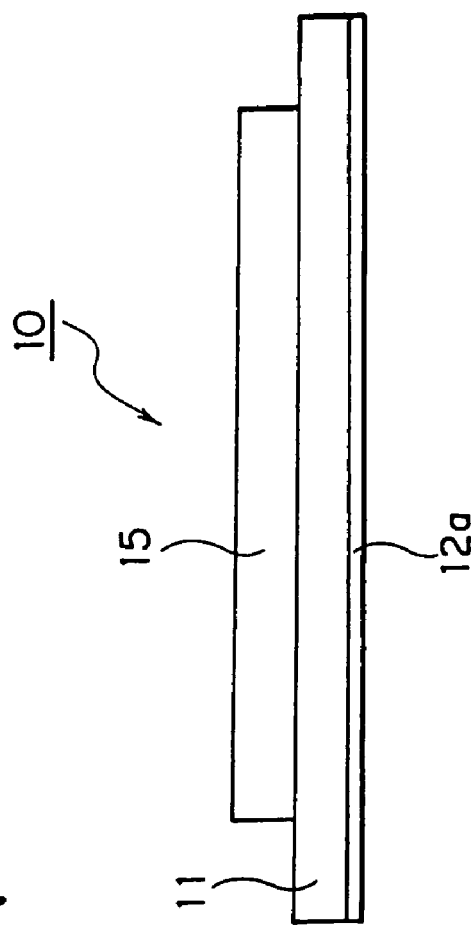
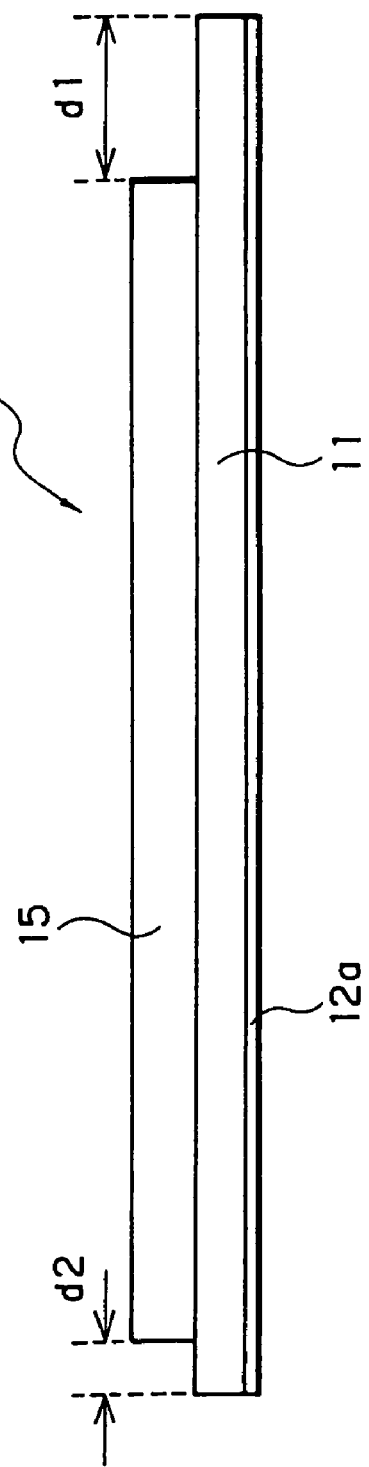
FIG. 3A
FIG. 3B

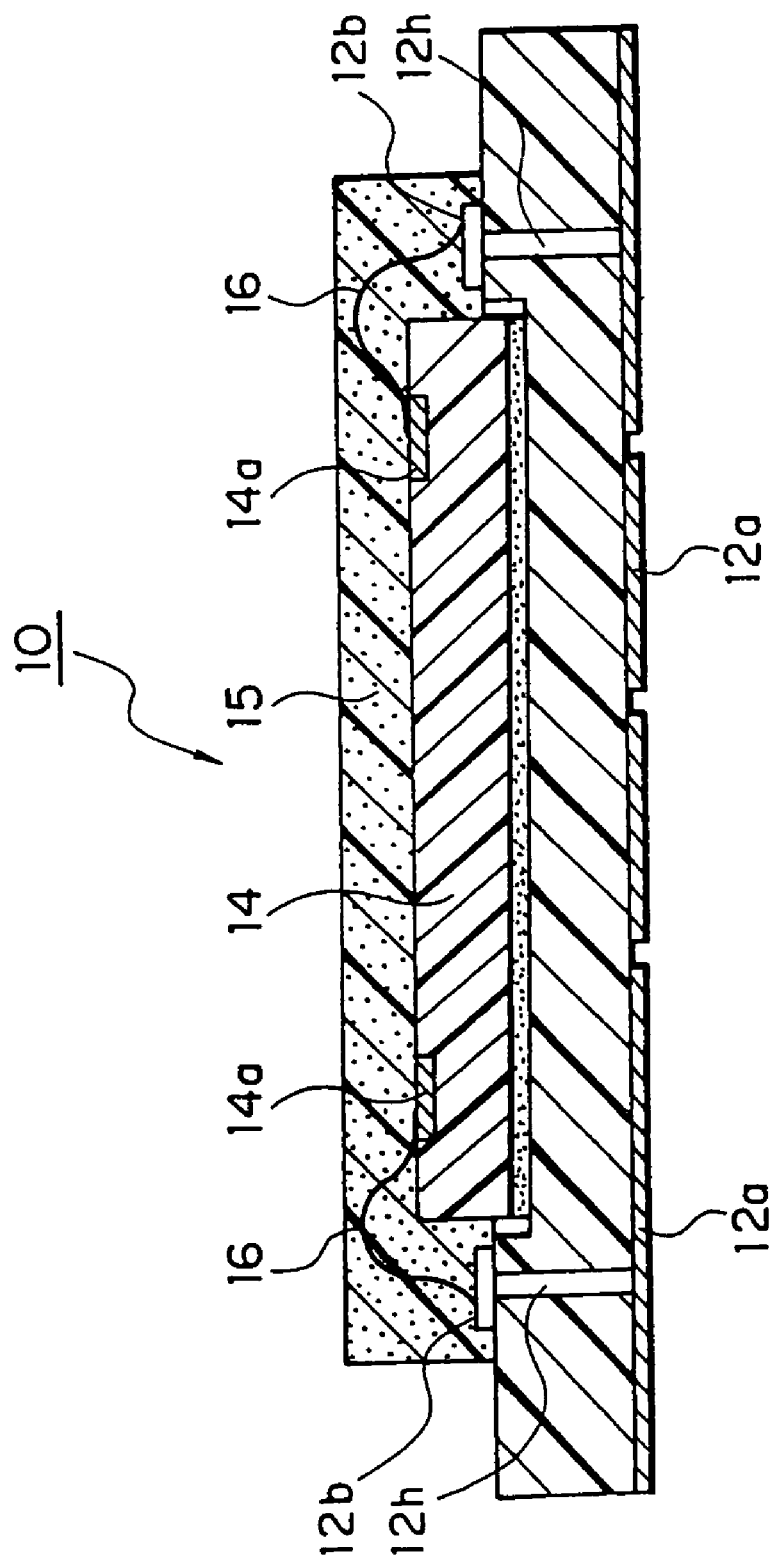

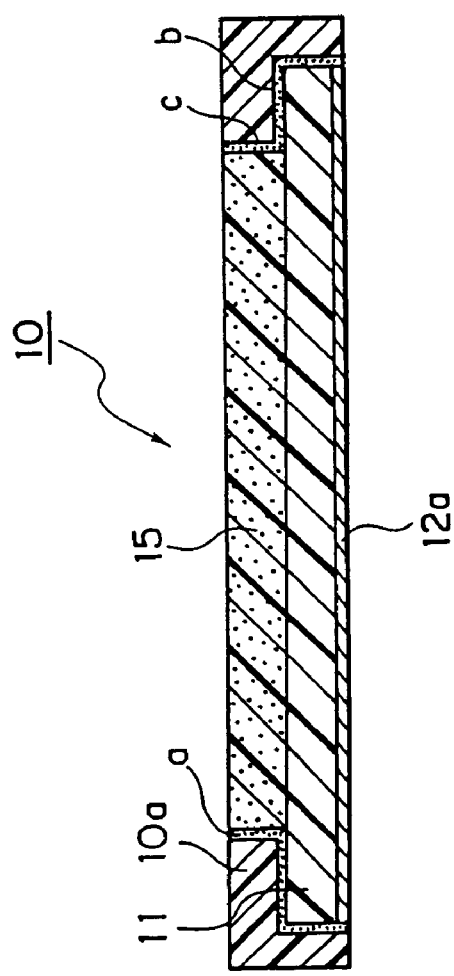
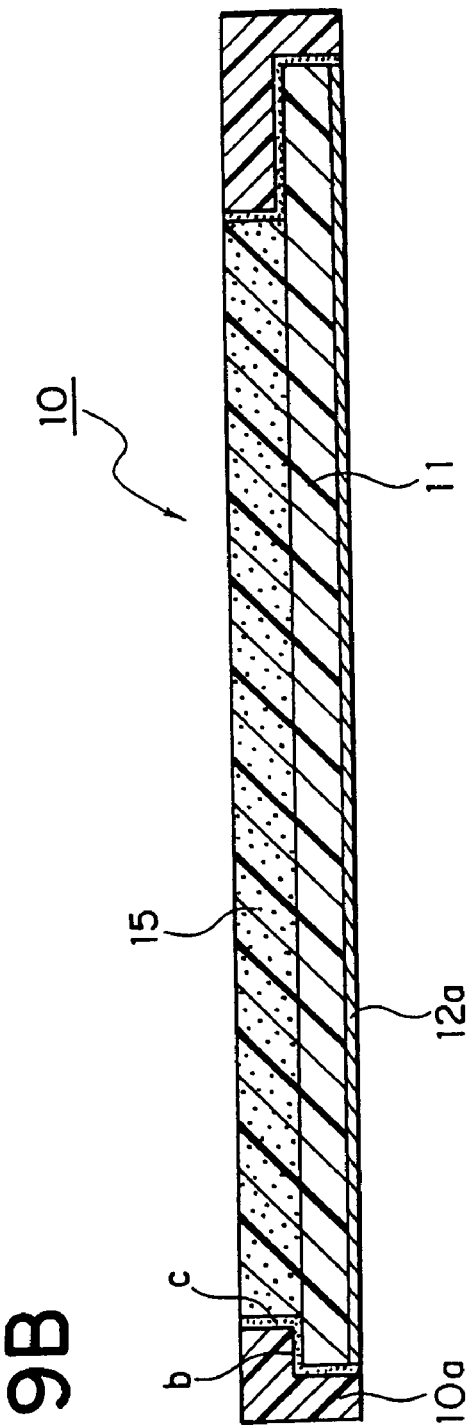

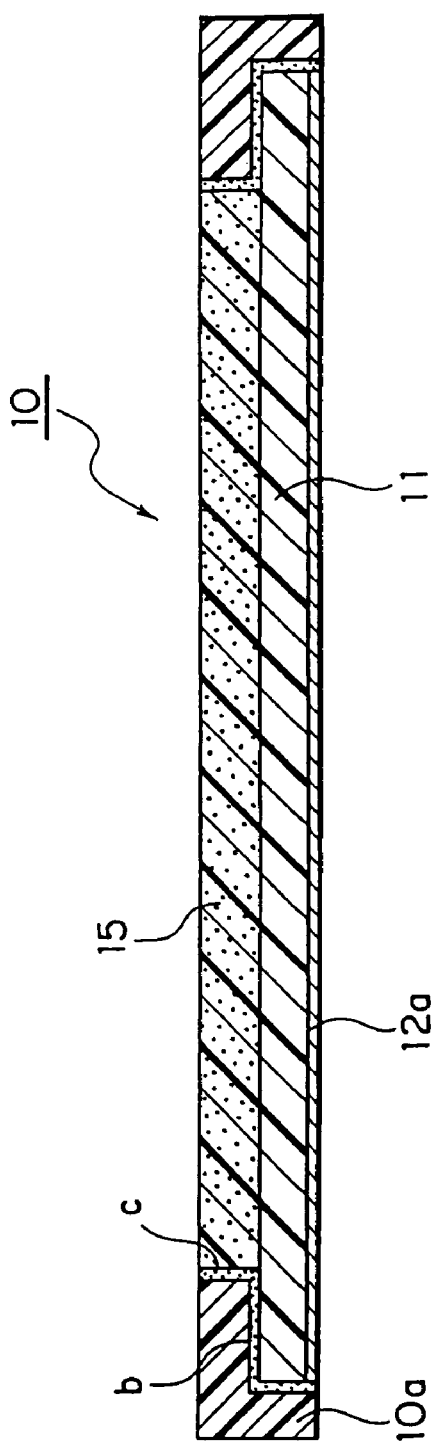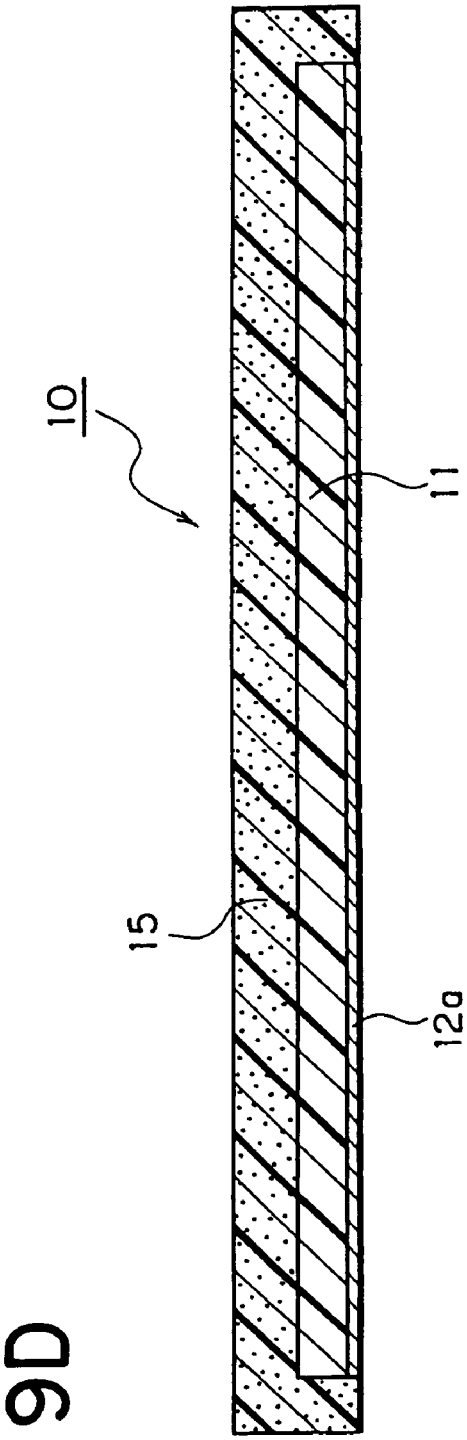
FIG. 19C
FIG. 19D

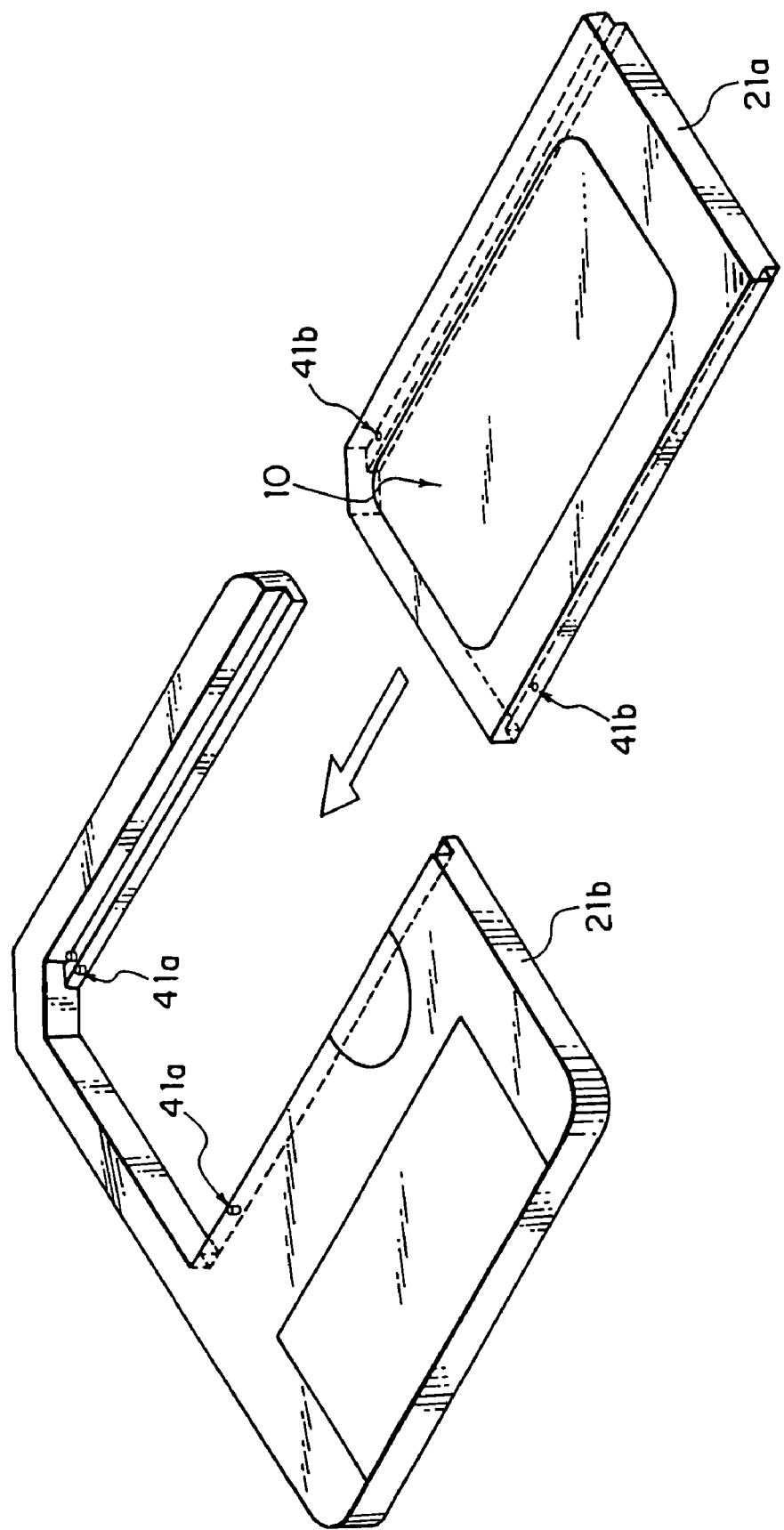

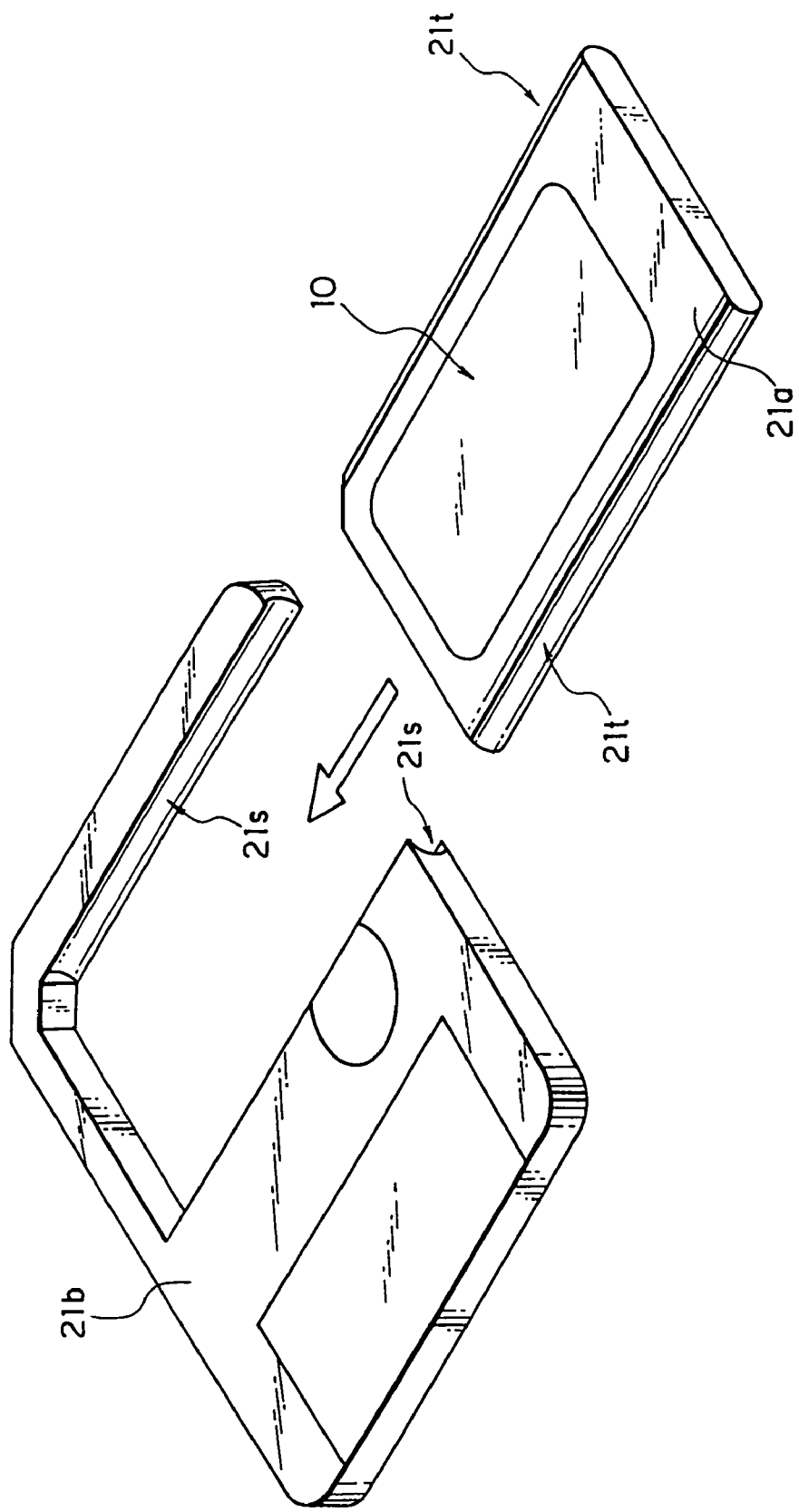

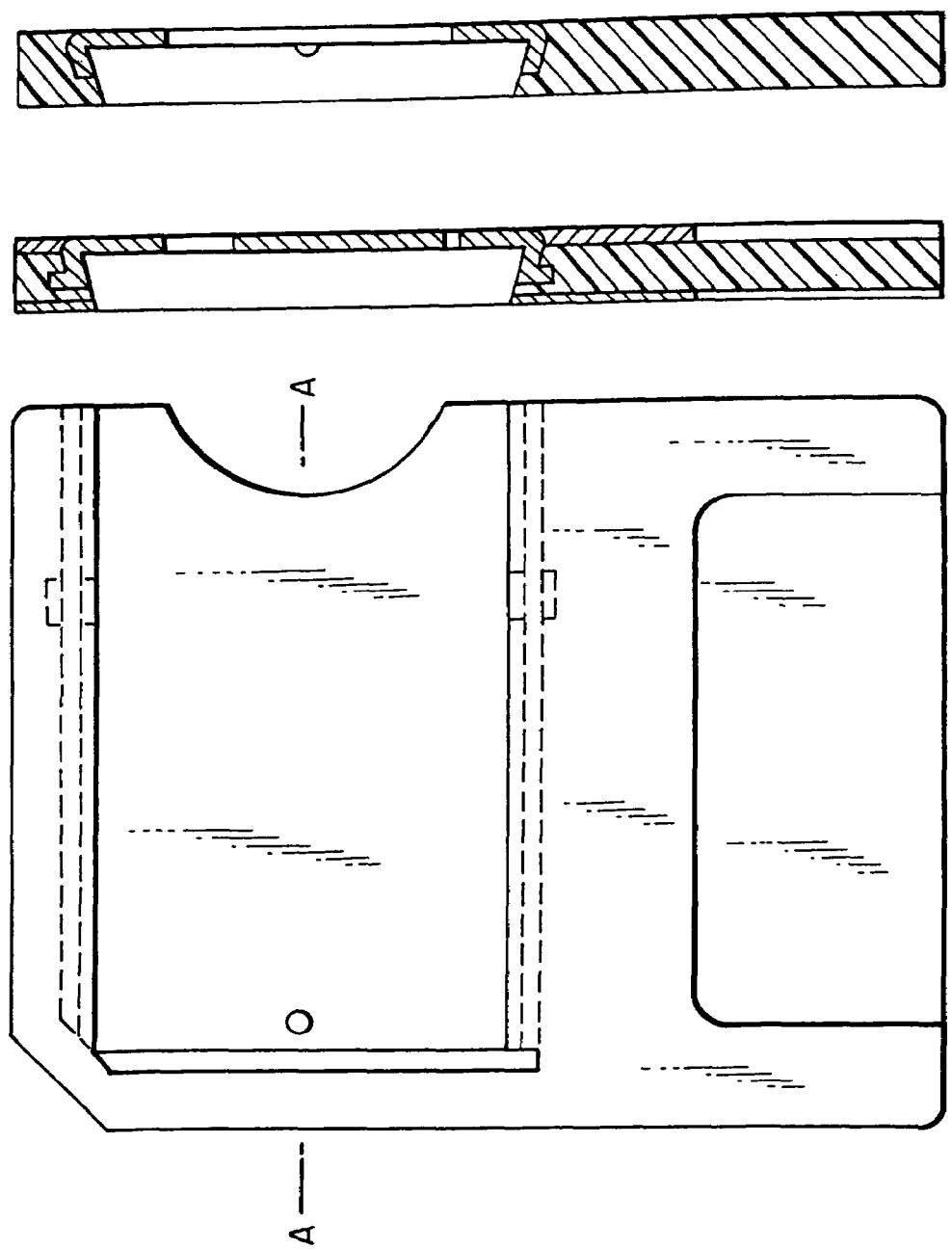

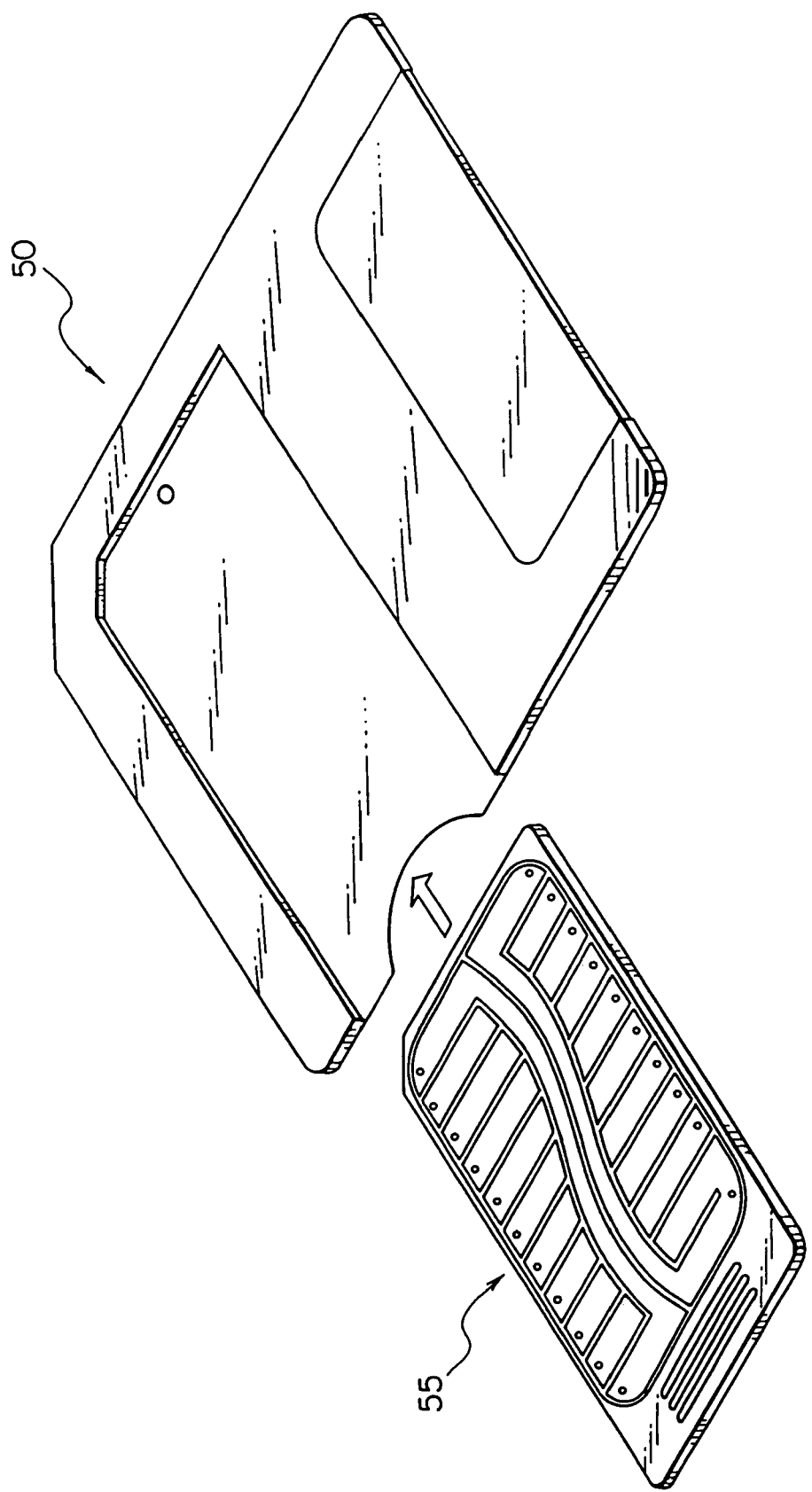

ACCESSIBLE ELECTRONIC STORAGE APPARATUS

This is a continuation of U.S. application Ser. No. 11/346,314, filed Feb. 3, 2006, (now U.S. Pat. No. 7,411,284), which is a continuation of U.S. application Ser. No. 10/640,038, filed Aug. 14, 2003 (now U.S. Pat. No. 7,019,392), which is a divisional of U.S. application Ser. No. 09/275,815, filed Mar. 25, 1999 (now U.S. Pat. No. 6,642,611), which is based upon and claims the benefit of priority to Japanese Patent Application No. 10-079574, filed Mar. 26, 1998, the entire contents of all of which are incorporated herein by reference.

BACKGROUND OF THE INVENTION

1. Field of the Invention

The present invention relates to a storage apparatus, in particular, to a backward compatible storage apparatus suitable for transferring and exchanging digital information between various portable electronic apparatuses. In addition, the present invention relates to a card type storage apparatus, in particular, to a card type storage apparatus suitable for transferring and exchanging digital information between various portable electronic apparatuses.

Moreover, the present invention relates to various portable wireless terminals such as a personal computer, a portable information terminal, a portable telephone unit, and a PHS (Personal Handyphone System) unit and various electronic apparatuses such as a digital camera and a voice recorder.

2. Description of the Related Art

In recent years, various types of information such as characters, still pictures, moving pictures, music, and voice are handled as digital data. Various types of storage mediums such as a magnetic tape, a floppy disk, a hard disk, and a magneto-optical disc have been used to record such types of digital data.

For example, a floppy disk is a most-widely used storage medium. However, since the medium should be rotatably-driven, a motor and a rotating mechanism are essentially required for a floppy disk drive. Thus, the floppy disk could not be a medium suitable for an electronic apparatus that is small and light.

In addition, portable wireless terminals such as portable telephone units and PHS units have become common and their size and weight have been reduced. However, such wireless terminals do not have detachable storage apparatuses. Thus, when a wireless terminal such as a portable telephone unit or a PHS unit is replaced with a new model, the directory and various settings of the old unit may not be used for the new unit. Thus, the contents of the directory and settings of the old unit should be manually input to the new unit.

A digital camera with a floppy disk drive that records photographed pictures on a floppy disk has been proposed. With such a digital camera, since photographed pictures are recorded on a floppy disk, the pictures can be used with a PC (Personal Computer) or the like. However, the size and weight of the digital camera depend on those of the floppy disk. Thus, since the digital camera becomes large and heavy, it is not suitable as a portable apparatus.

The storage apparatuses that such portable electronic apparatuses have do not satisfy both requirements of compatibility with other electronic apparatuses of prior generations and small/light structure necessary for portable apparatuses.

Thus, a storage apparatus that satisfies both requirements of compatibility with other electronic apparatuses of prior generations and small/light structure is required.

SUMMARY OF THE INVENTION

The present invention is made from the above-described point of view. An object of the present invention is to provide a storage apparatus that is small, thin, and light.

Another object of the present invention is to provide a storage apparatus that has compatibility with other electronic apparatuses of prior generations and that has small, thin, and light structure.

To solve such problems, the storage apparatus, the card type storage apparatus, and the electronic apparatus according to the present invention have the following structures.

The present invention is a storage apparatus, comprising a wiring substrate having a first surface and a second surface, a flat type external connection terminal disposed on the first surface of the wiring substrate, a semiconductor device disposed on the second surface of the wiring substrate and having a connection terminal connected to the flat type external connection terminal, and a card type molding resin for coating the semiconductor device on the second surface of the wiring substrate with the same height as an exposed surface of the flat type external connection terminal.

The present invention is a storage apparatus, comprising a wiring substrate having a first surface and a second surface, a flat type external connection terminal disposed an the first surface of the wiring substrate, a semiconductor device disposed on the second surface of the wiring substrate and having a connection terminal connected to the flat type external connection terminal, molding resin for coating the semiconductor device on the second surface of the wiring substrate, a card type supporting frame having a concave portion or a hole portion formed on at least one surface of the card type supporting frame, the concave portion or the hole portion fitting the wiring substrate, the semiconductor device, and the molding resin in such a manner that the flat type external connection terminal is exposed to the first surface of the wiring substrate, and adhesive resin filled in a supporting space formed among the flat type external connection terminal, the wiring substrate, the molding resin, and the card type supporting frame so as to integrally adhere the flat type external connection terminal, the wiring substrate, the semiconductor device, the molding resin, and the card type supporting frame.

A molding resin free portion is formed at an edge portion of the flat type external connection terminal. A concave portion or a hole portion of the card type supporting frame can be a shouldered concave portion or a shouldered hole portion having a first portion and a second portion, the first portion being fitted to the molding resin free portion of the flat type external connection terminal, the second portion being fitted to the molding resin portion of the flat type external connection terminal.

The area of the card type molding resin portion of the storage apparatus or the area of the card type supporting frame is the half or less of the area of the flat type external connection terminal.

The molding resin is preferably disposed on the second surface of the wiring substrate in such a manner that the molding resin is unsymmetrically disposed in one symmetrical direction on the second surface of the wiring substrate. In the following description, "molding resin unsymmetrically disposed in one symmetrical direction" represents for, example a rectangular substrate that is symmetrical with respect to a first line in parallel with the longer side of the substrate and passing through the center of the substrate and that is not symmetrical with respect to a second line perpendicular to the first line. The molding resin may have a mark, for example arrow, that represents a direction parallel to the symmetrical direction. Thus, since the storage apparatus is unsymmetrically shaped, the storage apparatus can be securely and easily attached to the host side unit. The mark is preferably a linear pattern. When a concave pattern is formed on the surface, the area becomes thin. Thus, the strength of the storage apparatus deteriorates. On the other hand, when a convex pattern is formed, since the thickness of the storage apparatus becomes large, the requirement for small and thin structure cannot be satisfied.

In addition, with the molding resin having one or plural notches the storage apparatus is unsymmetrically shaped and voltage display function or discrimination function and the like is provided. When the molding resin have notch, one symmetrical direction is not realized.

The semiconductor device may be a serial access type semiconductor. The semiconductor device may be a flash memory. The semiconductor device may be a NAND type EEPROM or an AND type EEPROM.

The serial access type semiconductor device sequentially inputs and outputs read data, write data, and commands through common I/O pins. The serial access type semiconductor device does not have an address terminal.

Thus, regardless of the integration degree of the semiconductor device, the structure of the flat type external connection terminal (for example, the number of pins) can be standardized.

The flat type external connection terminal may be composed of a conductor layer disposed on the first surface of the wiring substrate and having a slit for separating the first surface into a plurality of areas. Thus, the most portion of the surface of the wiring substrate can be coated with copper, gold, or the like. Consequently, the strength of the storage apparatus improves.

A pattern of the slit may connect any two points of the outer periphery of the conductor layer as a curved line or a bent line. Thus, the strength of the storage apparatus against bending force and twisting force improves.

The wiring substrate may have a barrier layer composed of metal, for example gold, the barrier layer being exposed to the molding resin free area on the second surface. Thus, when mold resin is formed corresponding to transfer mold method, the productivity improves. In other words, a gate from which non-harden resin is filled is formed on the barrier layer. Although resin such as prepreg of the wiring substrate securely adheres to the mold resin, such resin can be easily peeled off on the barrier layer.

The barrier layer may be electrically insulated from a connection terminal of the storage apparatus.

The present invention is a card type storage apparatus, comprising a storage apparatus having a wiring substrate having a first surface and a second surface, a flat type external connection terminal disposed on the first surface of the wiring substrate, a semiconductor device disposed on the second surface of the wiring substrate and having a connection terminal connected to the flat type external connection terminal, and molding resin for coating the semiconductor device on the second surface of the wiring substrate, and a card type supporting means having a first surface and for detachably supporting the storage apparatus in such a manner that the flat type external connection terminal is exposed to the first surface of the card type supporting means.

The present invention is a card type storage apparatus, comprising a storage apparatus having a wiring substrate having a first surface and a second surface, a flat type external connection terminal disposed on the first surface of the wiring substrate, a semiconductor device disposed on the second surface of the wiring substrate and having a connection terminal connected to the flat type external connection terminal, molding resin for coating the semiconductor device on the second surface of the wiring substrate, a card type supporting frame having a concave portion or a hole portion formed on at least one surface of the card type supporting frame, the concave portion or the hole portion fitting the wiring substrate, the semiconductor device, and the molding resin in such a manner that the flat type external connection terminal is exposed to the first surface of the wiring substrate, and adhesive resin filled between at least one of the flat type external connection terminal, the wiring substrate, the semiconductor device and the molding resin, and the card type supporting frame so as to adhere integrally the flat type external connection terminal.

In the card type storage apparatus, the storage apparatus according to the present invention is detachably attached to the supporting means. Thus, the storage apparatus can be easily handled.

The supporting means has a concave portion and a slit formed on the first surface thereof. The card type supporting frame is inserted into the concave portion. The slit is formed on both edge surfaces of the concave portion along the insertion direction of the card type molding resin or the card type supporting frame. Thus, the card type molding resin or the card type supporting frame can be fitted to the supporting means.

The supporting means has a tapered overhang portion for nipping the card type molding resin portion or the card type supporting frame, the tapered overhang portion being disposed on both edge surfaces of the concave portion along the insertion direction.

The supporting means has a concave portion with a shoulder corresponding to a molding resin area on the second surface of the wiring substrate and an exposed area on the first surface of the supporting means. In other words, in the storage apparatus according to the present invention, the molding resin is not disposed symmetrically with the second surface of the wiring substrate. Thus, the card that supports the storage apparatus should have a concave portion corresponding to the molding resin.

Consequently, the storage apparatus can be correctly attached to the supporting means. Thus, the storage apparatus can be prevented from malfunctioning and being damaged.

The depth of the concave portion may be larger than the thickness of the storage apparatus.

Thus, the semiconductor device can be protected against the stress applied in the direction of the thickness of the card type storage apparatus. The supporting means may be flexible.

The bottom portion of the supporting means that forms the concave portion may be composed of a metal plate such a a SUS plate so as to reinforce it.

The card type storage apparatus may further comprise a securing means for securing the storage apparatus supported by the supporting means.

Although the securing means secures the storage apparatus to the card type supporting means (the support card), the securing is preferably detachably structured. The securing means may be a double-adhesive tape or adhesive resin layer and the like disposed at the shoulder portion of the supporting means.

The adhesive strength between the double-adhesive tape and the supporting means is larger than the adhesive strength between the double-adhesive tape and the storage apparatus. Thus, the storage apparatus can be repeatedly attached and detached to/from the supporting means.

In addition, either the storage apparatus or the supporting means has a convex portion and the other one has a concave portion fitting to the convex portion. Thus, when the storage apparatus is inserted into the supporting means, the storage apparatus and the supporting means fit at the uneven part and detach each other with a designated power in the direction to separate.

The present invention is a card type storage apparatus comprising a storage apparatus having a wiring substrate having a first surface and a second surface, a flat type external connection terminal disposed on the first surface of the wiring substrate, a semiconductor device disposed on the second surface of the wiring substrate and having a connection terminal connected to the flat type external connection terminal, and molding resin for coating the semiconductor device on the second surface of the wiring substrate, and a card type supporting means having a first surface and for supporting the storage apparatus in such a manner that the flat type external connection terminal, is exposed to the first surface of the card type supporting means, wherein the supporting means is composed of a first portion and a second portion, the first, portion surrounding the storage apparatus the second portion being detachably connected to the first portion.

The second portion may have a slit for fitting the first portion.

The second portion may have an opening portion for fitting the first portion.

An edge surface of the first portion may be tapered. An edge of the opening portion of the second portion may have an overhang portion for nipping the edge surface of the first portion.

The first portion and the second portion may have a concave portion and a convex portion so as to secure the first portion and the second portion.

The second portion may be composed of a material with flexibility.

The card type storage apparatus according to the present invention complies with JEDEC MO-180 standard. In particular, the thickness of the card type storage apparatus should strictly comply with the standard. In other words, the thickness of the card type storage apparatus is 0.76 mm±0.08 mm or 1.4 mm±0.1 mm. The outer size of the card type, storage apparatus is 37.0 mm (wide)×45.0 mm (long).

The present invention is an electronic apparatus, comprising (a) a storage apparatus having a wiring substrate having a first surface and a second surface, a flat type external connection terminal disposed on the first surface of the wiring substrate, a semiconductor device disposed on the second surface of the wiring substrate and having a connection terminal connected to the flat type external connection terminal, and a card type molding resin layer for coating the semiconductor device on the second surface of the wiring substrate with the same height as the exposed surface of the flat type external connection terminal, (b) a supporting means for supporting the storage apparatus, (c) a connection electrode that is contacted to the flat type connection terminal when the storage apparatus is supported by the supporting means, and (d) a driving circuit for accessing the semiconductor device through the connection electrode and the flat type external connection terminal.

The present invention is an electronic apparatus, comprising (a) a wiring substrate having a first surface and a second surface, a flat type external connection terminal disposed on the first surface of the wiring substrate, a semiconductor device disposed on the second surface of the wiring substrate and having a connection terminal connected to the flat type external connection terminal, molding resin for coating the semiconductor device on the second surface of the wiring substrate, a card type supporting frame having a concave portion or a hole portion formed on at least one surface of the card type supporting frame, the concave portion or the hole portion fitting the wiring substrate, the semiconductor device, and the molding resin in such a manner that the flat type external connection terminal is exposed to the first surface of the wiring substrate, and adhesive resin filled in a supporting space formed among the flat type external connection terminal, the wiring substrate, the semiconductor device, the molding resin, and the card type supporting frame so as to integrally adhere the flat type external connection terminal, the wiring substrate, the semiconductor device, the molding resin, and the card type supporting frame, (b) a supporting means for supporting the storage apparatus, (c) a connection electrode that is contacted to the flat type connection terminal when the storage apparatus is supported by the supporting means, and (d) a driving circuit for accessing the semiconductor device through the connection electrode and the flat type external connection terminal.

It is preferred that the driving circuit serially accesses the semiconductor device.

According to the present invention, since the molding resin is unsymmetrically disposed on the wiring substrate, the storage apparatus can be properly attached to the host side unit. Thus, characteristics of small, thin, and light structure are satisfied, the user can easily know the attaching direction of the storage apparatus to the host side unit. Consequently, the semiconductor apparatus can be prevented from malfunctioning and being damaged.

According to the present invention, since the molding resin is unsymmetrically disposed on the wiring substrate, the storage apparatus can be properly attached to the host side unit. Thus, the user-friendliness improves. In addition, the semiconductor apparatus can be prevented from malfunctioning and being damaged.

In the storage apparatus according to the present invention, since the serial access type memory device and the flat type external connection terminal are used in combination, the outer size of the storage apparatus becomes close to the outer size of the memory device. Thus, the storage apparatus according to the present invention is suitable for an external storage apparatus used in a small mobile communication terminal such as a portable telephone unit, a PHS unit, a pocket bell, or a PDA.

In addition, when the serial access type memory device and the flat type external connection terminal are used in combination, the structure of the flat type external connection electrodes of the storage apparatus and the structure of the host side electronic apparatus can be standardized.

In the card type storage apparatus according to the present invention, since the molding resin of the storage apparatus is unsymmetrically fitted to the support card, the storage apparatus can be properly attached to the support card. Thus, the user-friendliness improves. Consequently, the storage apparatus can be prevented from malfunctioning and being damaged.

In the card type storage apparatus according to the present invention, since the support card is separated into a plurality of portions, the storage apparatus can be connected to a host side unit that is smaller than the outer size of the support card.

In the electronic apparatus according to the present invention, the storage apparatus can be properly attached to the electronic apparatus. Thus, when the storage apparatus is connected to a host side electronic apparatus such as a portable telephone unit, a PHS unit, a pocket bell, a PDA, a PC, or a digital camera, the electronic apparatus can be prevented from malfunctioning or being damaged. In addition, the user-friendliness remarkably improves. So far, it was difficult to accomplish an external connecting unit that can be used in common with a portable telephone unit, a PHS unit, a pocket bell, a PDA unit, a digital camera, a note type PC, a PC, and so forth. However, with the storage apparatus and the electronic apparatus according to the present invention, data such as telephone numbers registered to a portable telephone unit, text data, picture data, and so forth received through Internet can be transferred to and shared with other information processing units.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 3A is a side view on a shorter side of the storage apparatus shown in FIG. 1;

FIG. 3B is side view parallel to the storage apparatus on a longer side shown in FIG. 1;

FIG. 4 is a sectional view showing an example of the structure of the storage apparatus according to the first embodiment of the present invention;

FIG. 19A is a sectional views parallel to a shorter side of the storage apparatus of FIG. 12;

FIG. 19B is a sectional view parallel to a longer side of the storage apparatus of FIG. 12;

FIG. 19C is a sectional view, parallel to a longer side of the storage apparatus of FIG. 10;

FIG. 19D is a sectional view, showing another example of the structure, parallel to a longer side of the storage apparatus according to the fourth embodiment of the present invention;

FIG. 20 is a perspective view showing an example of the structure of a card type storage apparatus according to a fifth embodiment of the present invention;

FIG. 21 is a perspective view showing an example of the structure of a card type storage apparatus according to a sixth embodiment of the present invention;

FIG. 23A is a plan view showing an example of the structure of a support card of a card type storage apparatus according to an eighth embodiment of the present invention;

FIG. 23B is a sectional view taken along line A-A shown in FIG. 23A;

FIG. 23C is a sectional view of a support card in another embodiment corresponding to FIG. 23B;

FIG. 25C is a perspective view showing the storage apparatus of FIG. 25A and a support card.

DESCRIPTION OF PREFERRED EMBODIMENTS

Next, embodiments of the present invention will be described in detail.

First Embodiment

Figure 1:
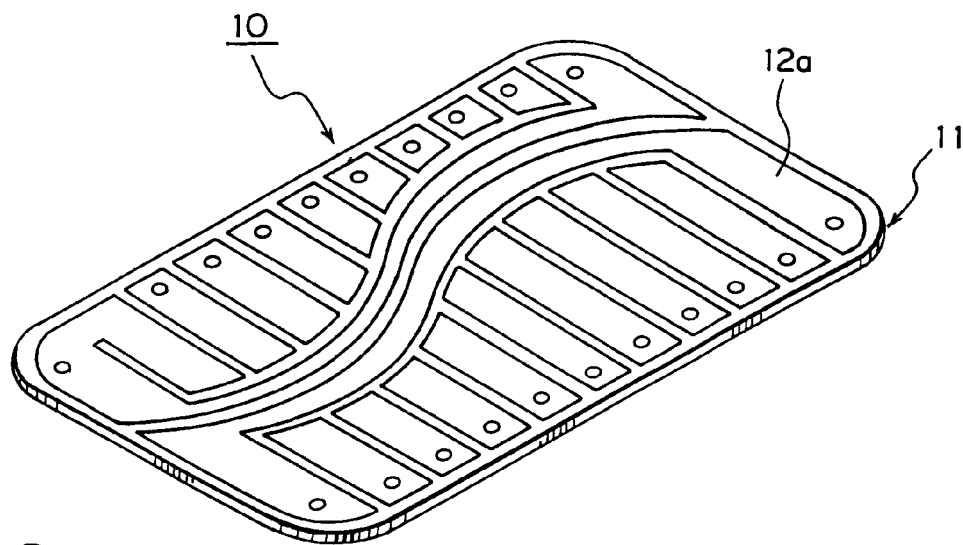
FIG. 1 is a perspective front view showing an example of the structure of a storage apparatus according to a first embodiment of the present invention.
Figure 2:
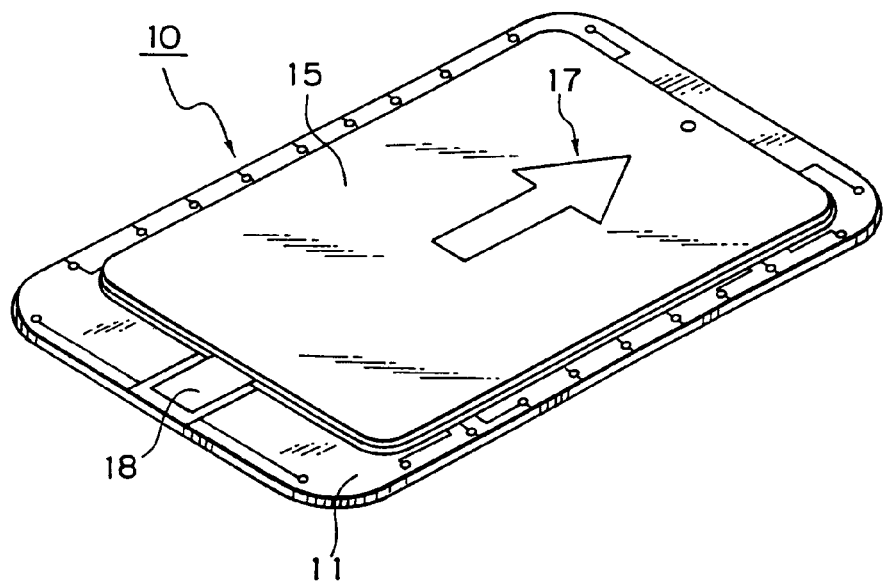
FIG. 2 is a perspective rear view showing the structure of the storage apparatus shown in FIG. 1.

FIGS. 1 and 2 are a perspective front view and a perspective rear view showing an example of the structure of a storage apparatus according to a first embodiment of the present invention, respectively.

FIG. 3A is a sectional view on a shorter side of the storage apparatus shown in FIGS. 1 and 2. FIG. 3B is a sectional view on a longer side of the storage apparatus shown in FIGS. 1 and 2.

FIG. 4 is a detailed sectional view showing an example of the structure of the storage apparatus parallel to the first embodiment of the present invention on a shorter side.

In FIG. 4, reference numeral 10 is a storage apparatus The storage apparatus 10 comprises a wiring substrate 11, a flat type external connection terminal 12a, a semiconductor device 14, and molding resin 15. The wiring substrate 11 has a first surface and a second surface. The flat type external connection terminal 12a is disposed on the first surface of the wiring substrate 11. The semiconductor device 14 is disposed on the second surface of the wiring substrate 11. The semiconductor device 14 has a connection terminal 14a connected to the flat type external connection terminal 12a The molding resin 15 unsymmetrically coats the semiconductor device 14 on the second surface of the wiring substrate 11.

In the example, the semiconductor device 14 is disposed at a concave portion on the upper surface (second surface) of the wiring substrate 11 through a bonding agent layer (not shown). The connection terminal 14a of the semiconductor device 14 and the connection terminal 12b of the wiring substrate 11 are connected with a bonding wire 16. The connection terminal 12b of the wiring substrate and the flat type external connection terminal 12a are connected through a via-hole 12h. Since the semiconductor device 14 is disposed at the concave portion formed on the upper surface of the wiring substrate 11, the height of the storage apparatus is reduced.

In the example, the semiconductor device 14 is a NAND type EEPROM that is a serial access memory device. Alternatively, as the semiconductor device 14, an AND type EEPROM or another memory device can be used.

The semiconductor device 14 may be connected to the wiring substrate 11 with a flip-chip using conductive bumps (corresponding to face-down bonding method) rather than the bonding wires 16. In addition, the layers of the wiring substrate 11 may be connected with conductive pillars rather than the via-holes 14h.

In the storage apparatus 10 according to the present invention, the molding resin 15 is unsymmetrically disposed on the second surface of the wiring substrate 11. In the example, the molding resin 15 deviates to the longer side of the wiring substrate 11.

In such a structure, the storage apparatus according to the present invention can be correctly attached to (inserted into) a host side electronic apparatus 30. Thus, the storage apparatus can be prevented from malfunctioning and being damaged. The host side electronic apparatus is for example a portable telephone unit, a PHS unit, a pocket bell (beeper), a PDA, a PC (Personal Computer), and a digital camera.

In the example, as shown in FIG. 2, a mark 17 that represents the inserting direction of the storage apparatus is placed on the front surface of the molding resin 15. The mark 17 is preferably formed with a linear pattern rather than a concave patter or a convex pattern.

On the second surface of the wiring substrate 11 (namely, on the surface of which the semiconductor device 14 is disposed), a metal barrier 18 is disposed along with a wiring pattern on the wiring substrate 11. With the metal barrier 18, when the molding resin 15 is formed with transfer mold or the like, the strength of the wiring substrate 11 improves. In addition, the resin can be easily peeled off a mold.

Since text data, picture data, music data, medical data, financial data, various types of authentication data, and so forth can be handled with the storage apparatus according to the present invention, data can be exchanged among a plurality of host side electronic apparatuses. In addition, the storage apparatus according to the present invention can highly maintain compatibility with various electronic apparatuses.

Second Embodiment

Figure 5A:
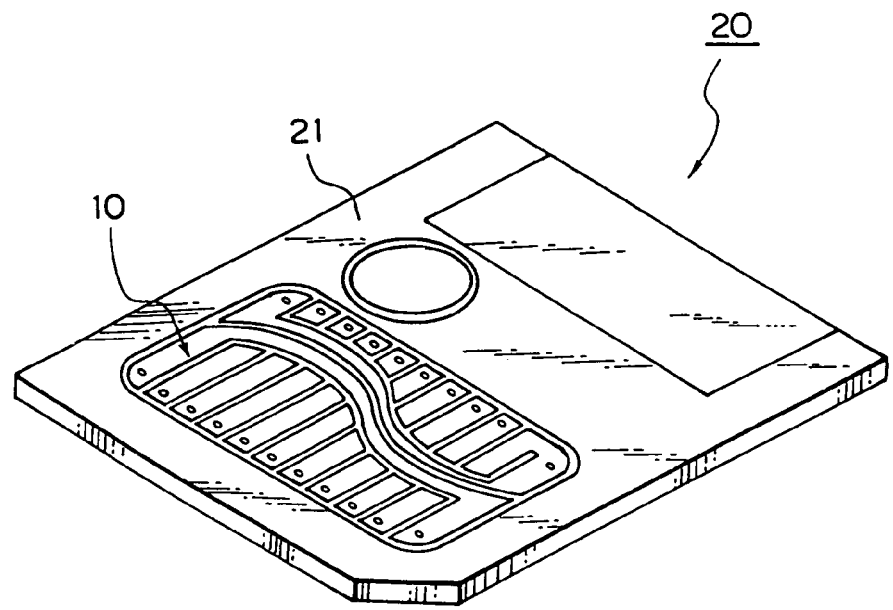
FIG. 5A is perspective view showing an example of the structure of a card type storage apparatus according to a second embodiment of the present invention.
Figure 5B:
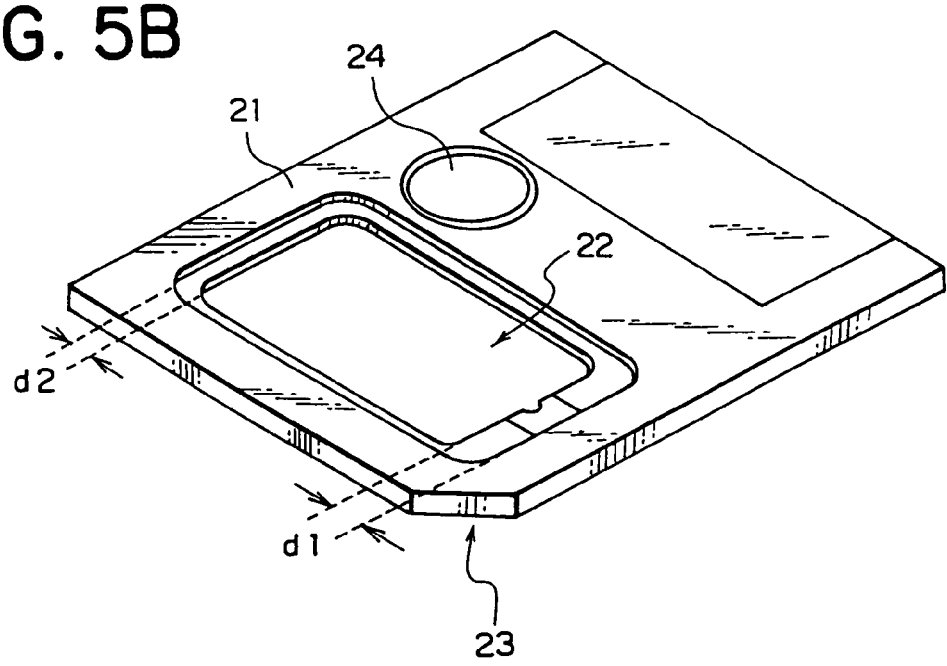
FIG. 5B is perspective view showing an example of the structure of a support card of a storage apparatus according to a second embodiment of the present invention.

FIG. 5A is a perspective view showing an example of the structure of a card type storage apparatus according to a second embodiment of the present invention, and FIG. 5B is a perspective view showing a support card of the card type storage apparatus.

In the card type storage apparatus, the storage apparatus according to the first embodiment of the present invention is held by a support card.

In FIGS. 5A and 5B, reference numeral 20 is a card type storage apparatus 20 according to the second embodiment of the present invention. The card type storage apparatus 20 comprises a storage apparatus 10 according to the first embodiment of the present invention and a support card 21. The support card 21 detachably supports the storage apparatus 10 in such a manner that the flat type external connection terminal 12a is exposed.

The support card 21 has a concave portion 22 that supports the storage apparatus 10. The concave portion 22 is formed so that it fits the shape of the molding resin 15 of the storage apparatus 10. In other words, since the molding resin 15 in the storage apparatus 10 according to the present invention is unsymmetrically disposed against the wiring substrate 11, the concave portion 22 of the support card 21 is formed corresponding to the shape of the molding resin 15 of the storage apparatus 10. Thus, the concave portion 22 has a shoulder portion corresponding to a frame area in which the molding resin 15 is not disposed on the semiconductor device side of the wiring substrate 11. With the shoulder portion, the storage apparatus is supported. Depending on the unsymmetrically disposed molding resin 15, the width of the shoulder portion may vary so that d1>d2 (where d1 is the width of the shoulder portion on one side of the concave portion 22; and d2 is the width of the shoulder portion on the other side of the concave portion 22). With such a structure, the storage apparatus 10 can be properly attached to the support card 21. Thus, when the card type storage apparatus is connected to a host side electronic apparatus such as a digital camera or a personal computer (including PC through a PCMCIA card), the card type storage apparatus can be prevented from malfunctioning and being damaged. In addition, the user-friendliness remarkably improves.

The depth of the concave portion 22 of the support card 21 is slightly larger than the thickness of the storage apparatus 10. Thus, when the storage apparatus 10 is supported by the support card 21 or when electrodes of a host side electronic apparatus are accessed to the flat type external connection terminal 12a, the stress applied in the direction of the thickness of the storage apparatus can be alleviated. Consequently, the reliability of the storage apparatus 10 improves.

An adhesive tape may be placed on the shoulder portion of the concave portion 22 so as to secure the storage apparatus 10. By adjusting the adhesive strength of the adhesive tape to the wiring substrate 11 and the support card 21, when necessary, the storage apparatus 11 can be detached from the support card 21.

The support card 21 has a cut-out portion 23 and a write protect area 24. With the cut-out portion 23, the operation voltage of the semiconductor device 14 of the storage apparatus 10 is determined. With the write protect area 24, the data write enable state is determined. When a seal is adhered to the write protect area 24, data can be prohibited from being written to the storage apparatus 10.

When the outer size of the support card (base card) of the card type storage apparatus according to the present invention is the same as that of for example a smart medium, data can be exchanged with a small electronic apparatus while maintaining electrical and mechanical interfaces with the smart medium.

Third Embodiment

Figure 6:
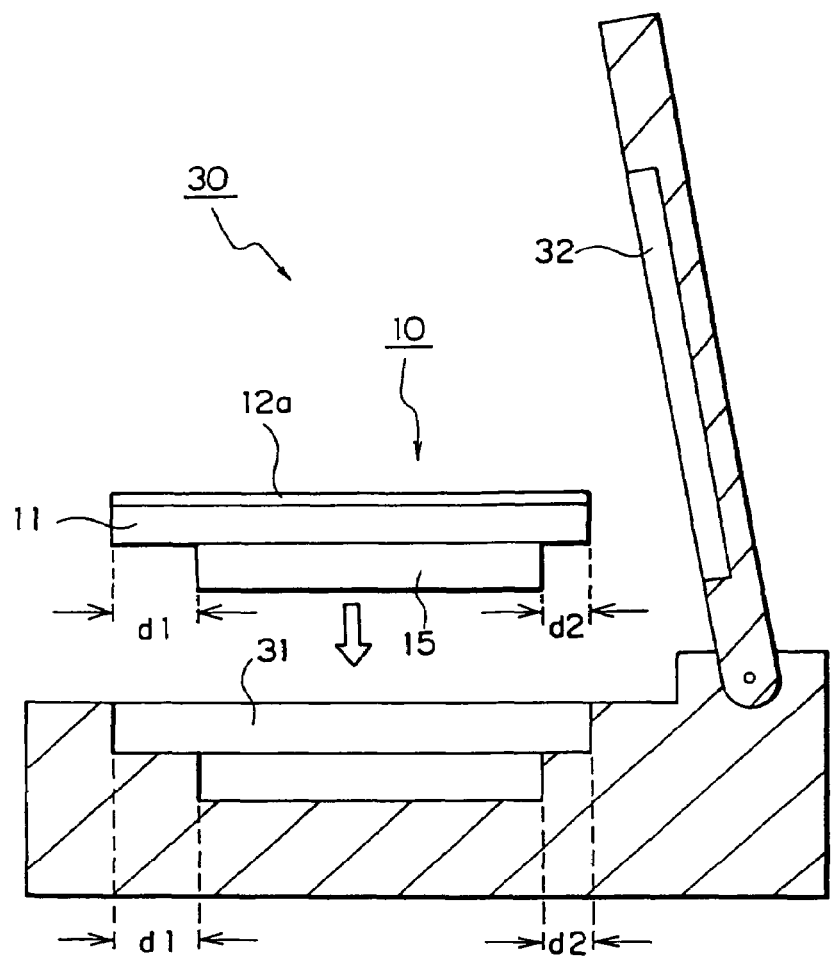
FIG. 6 is a sectional view showing an example of the structure of an electronic apparatus according to a third embodiment of the present invention.
Figure 7:
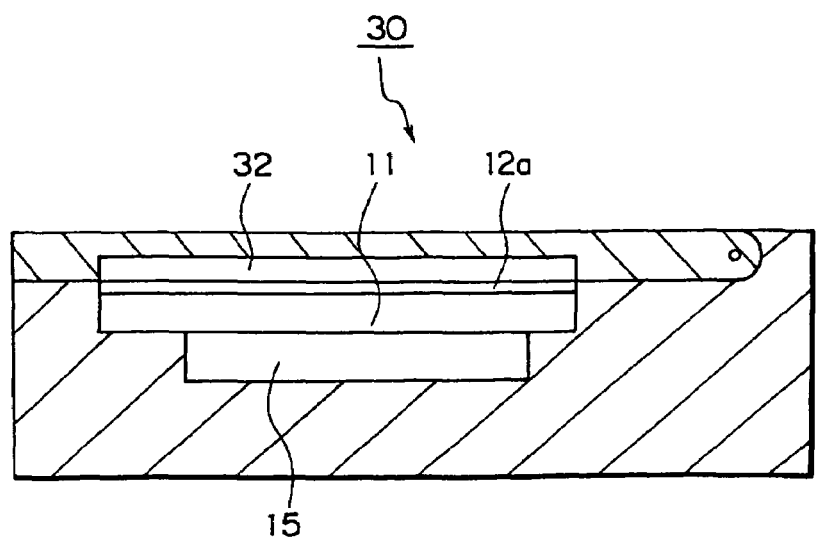
FIG. 7 is a sectional view showing an example of the structure of an electronic apparatus according to the third embodiment of the present invention.

FIGS. 6 and 7 are sectional views showing an example of the structure of an electronic apparatus according to a third embodiment of the present invention.

FIG. 6 shows the state of which the storage apparatus 10 is detached from the electronic apparatus 30 according to the present invention. FIG. 7 shows the state of which the storage apparatus 10 according to the present invention is attached to the electronic apparatus 30 according to the present invention.

The electronic apparatus 30 comprises a concave portion 31, a connection electrode 32, and a driving circuit (not shown). The concave portion 31 supports the storage apparatus according to the present invention. When the storage apparatus 10 is supported with the concave portion 31, the connection electrode 32 is connected to the flat type connection terminal 12a of the storage apparatus 10. The driving circuit drives the semiconductor device 14 through the connection electrode 32 and the flat type external connection terminal 12a. The driving circuit is for example a driver IC. The electronic apparatus is for example a portable telephone unit, a PHS unit, a pocket bell, a PDA, a digital camera, a note type PC, a PC, a voice recorder, or an electronic book.

The structure of the concave portion 30 of the electronic apparatus 30 is the same as the concave portion 22 of the support card 21. Thus, the concave portion 31 has a shoulder portion corresponding to a frame area in which the molding resin 15 is not disposed on the semiconductor device side of the wiring substrate 11 of the storage apparatus 10. With the shoulder portion, the storage apparatus is supported. Depending on the unsymmetrically disposed molding resin 15, the width of the shoulder portion may vary so that d1>d2 (where d1 is the width of the shoulder portion on one side of the concave portion 31; and d2 is the width of the shoulder portion on the other side of the concave portion 31).

With such a structure, the storage apparatus 10 can be properly attached to the electronic apparatus 30. Thus, when the card type storage apparatus is connected to the host side electronic apparatus 30 such as a portable telephone unit, a PHS unit, a pocket bell, a PDA, a PC, or a digital camera, the storage apparatus 10 can be prevented from malfunctioning and being damaged. In addition, the user-friendliness remarkably improves.

Figure 8:
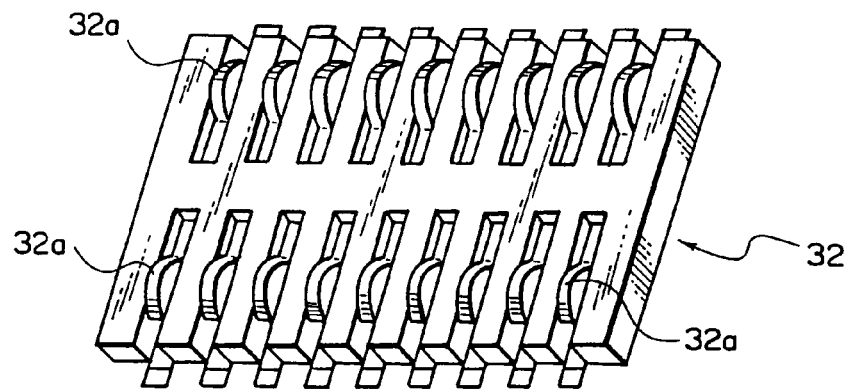
FIG. 8 is a perspective view showing an example of the structure of connection electrodes of the electronic apparatus according to the third embodiment of the present invention.

FIG. 8 is a perspective view showing an example of the structure of the connection electrode 32 of the electronic apparatus 30 according to the third embodiment of the present invention.

The connection electrode 32 has a plurality of pins 32a corresponding to the flat type external connection terminal 12a of the storage apparatus 10. The host side driving circuit is accessed to the semiconductor device 14 through the pins 32a and the flat type external connection terminal 12a.

In the storage apparatus 10 according to the present invention, the molding resin 15 is unsymmetrically disposed. In addition, the concave portion of the host side electronic apparatus 30 has the shoulder portion which realizes unsymmetry. Thus, the connection electrode 32 of the electronic apparatus 30 can be correctly connected to the flat type external connection terminal 12a of the storage apparatus 10. Consequently, the reliability of the system improves. In addition, the user-friendliness improves.

So far, it was difficult to accomplish an external connecting unit that can be used in common with a portable telephone unit, a PHS unit, a pocket bell, a PDA, a digital camera, a note type PC, a PC, and so forth. However, with the storage apparatus according to the present invention or the electronic apparatus according to the present invention, data such as telephone numbers stored in a portable telephone unit and text data, picture data, and so forth received through Internet can be transferred to another information processing unit or shared therewith. Likewise, such data can be transmitted. For example, with a digital camera or a portable telephone unit that can be accessed to the storage apparatus according to the present invention, a picture photographed by the digital camera can be easily transmitted through the portable telephone unit.

Fourth Embodiment

FIGS. 9, 10, 11, 12, 13, 14, 15, 16, 17, 18, 19A, 19B, 19C and 19D are plan views and sectional views showing examples of the structure of a card type storage apparatus according to a fourth embodiment of the present invention.

Figure 9:
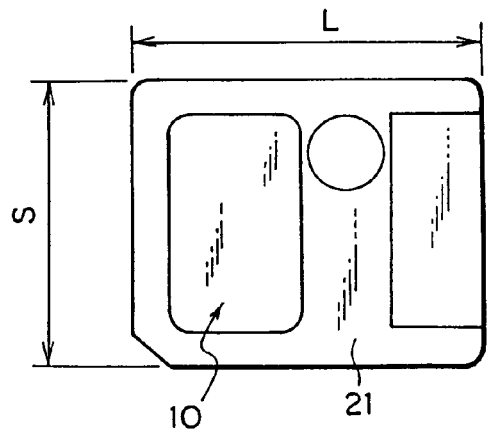
FIG. 9 is a plan view showing another example of the structure of a card type storage apparatus according to a fourth embodiment of the present invention.

The structure of the card type storage apparatus shown in FIG. 9 is the same as the structure of the card type storage apparatus 20 shown in FIGS. 5A and 5B. The card type storage apparatus shown in FIG. 9 comprises a storage apparatus 10 and a support card 21. The support card 21 supports the storage apparatus 10.

The storage apparatus 10 has a structure shown in FIGS. 19A and 19B. FIG. 19A is a sectional drawing parallel to a shorter side of the storage apparatus. FIG. 19B is a sectional drawing parallel to a longer side of the storage apparatus.

In other words, the storage apparatus 10 shown in FIG. 3 is fitted to a frame member 10a composed of synthetic resin The storage apparatus 10 and the frame member 10a are adhere d with adhesive resin a.

The frame member 10a has a shoulder portion b and a hole portion c. With the shoulder portion b, a substrate 11 is fitted to the frame member 10a. With the hole portion c, a molding resin portion 15 is fitted to the frame member 10a. Since the storage apparatus 10 is fitted to the shouldered hole portion, the storage apparatus 10 is formed in a card shape.

In the storage apparatus 10, as shown in FIG. 19C, the molding resin portion 15 may be disposed on the center of the substrate 11, instead of being disposed unsymmetrically against the substrate 11.

In addition, as shown in FIG. 19D, the frame member 10a can be substitute for the molding resin portion 15.

In the example shown in FIG. 9, the length L on the longer side of the support card 21 is around 45.0 mm. The length S on the shorter side of the support card 21 is around 37.0 mm. When the storage apparatus 10 is detached from the support card 21 and only the storage apparatus 10 is attached to the host side electronic apparatus 30, the electronic apparatus 30 can be compactly formed.

In the examples shown in FIGS. 10 to 18, the support card 21 is detachable from the frame member 10a including the storage apparatus or from the molding resin portion 15.

Figure 10:
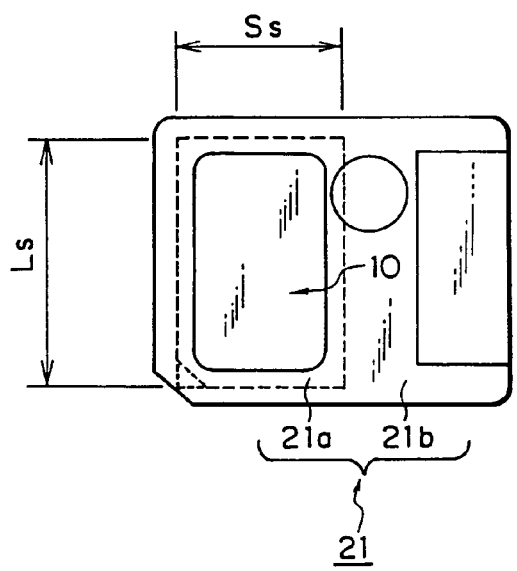
FIG. 10 is a plan view showing another example of the structure of the card type storage apparatus according to the fourth embodiment of the present invention.

In the card type storage apparatus shown in FIG. 10, a support card 21 has a first area 21a and a second area 21b. The first area 21a is formed in a frame shape and surrounds the storage apparatus 10. The second area 21b is disposed outside the first area 21a. In the card type storage apparatus shown in FIG. 10, the first area 21a is detachable from the second area 21b.

The frame shape first area 21a is the area in which the frame member 10a substitute for the molding resin portion 15 shown in FIG. 19D, or the storage apparatus 10 is fitted to a frame member 10a composed of synthetic resin and the storage apparatus 10 and the frame member 10a are adhered with adhesive resin a shown in FIGS. 19A, 19B and 19C.

In the example, the support card 21 is formed in a rectangular shape of which the length Ls on the longer side of the first area 21a of the support card is 30.0 mm and the length Ss on the shorter side of the first area 21a of the support card is 19.0 mm.

Figure 11:
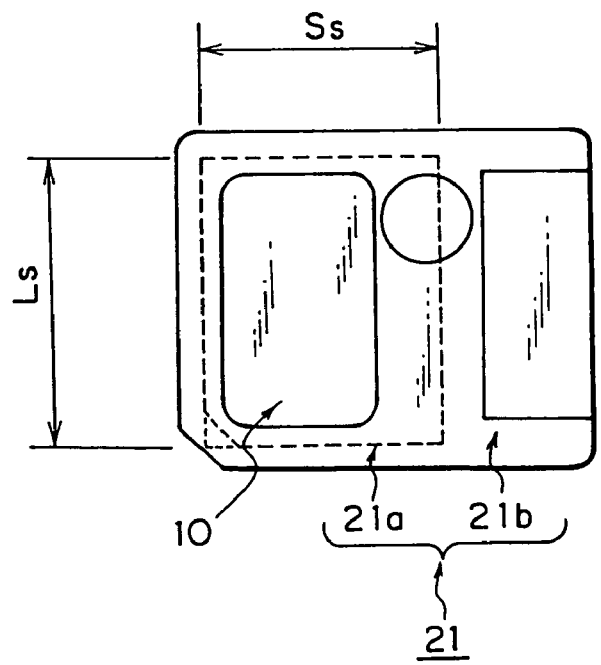
FIG. 11 is a plan view showing another example of the structure of the card type storage apparatus according to the fourth embodiment of the present invention.

In the card type storage apparatus shown in FIG. 11, a support card 21 has a first area 21a and a second area 21b. The first area 21a is formed in a frame shape and surrounds the storage apparatus 10. The second area 21b is disposed outside the first area 21a. In the card type storage apparatus shown in FIG. 11, the first area 21a is detachable from the second area 21b.

In the example, the support card 21 is formed in a rectangular shape of which the length Ls on the longer side of the first area 21a of the support card is 30.0 mm and the length Ss on the shorter side of the first area 21a of the support card is 23.0 mm.

Figure 12:
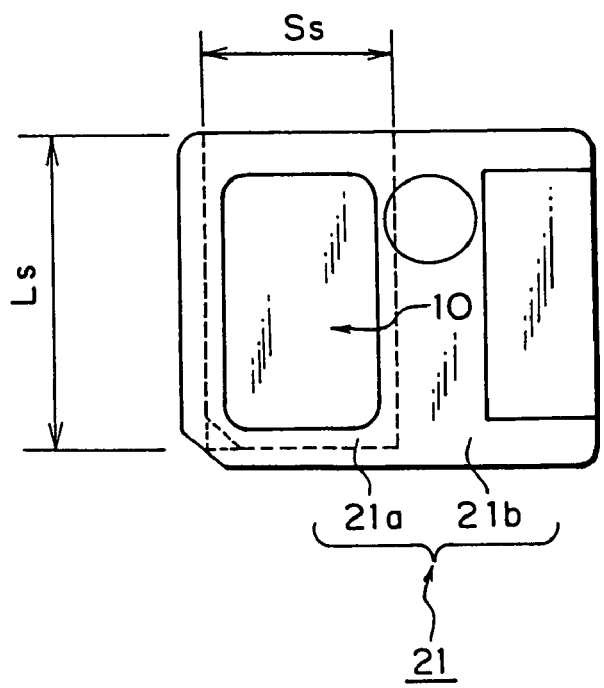
FIG. 12 is a plan view showing another example of the structure of the card type storage apparatus according to the fourth embodiment of the present invention.

In the card type storage apparatus shown in FIG. 12, a support card 21 has a first area 21a and a second area 21b. The first area 21a is formed in a frame shape and surrounds the storage apparatus 10. The second area 21b is disposed outside the first area 21a. In the card type storage apparatus shown in FIG. 12, the first area 21a is detachable from the second area 21b.

In the example, the support card 21 is formed in a rectangular shape of which the length Ls on the longer side of the first area 21a of the support card is 35.5 mm and the length Ss on the shorter side of the first area 21a of the support card is 19.0 mm.

Figure 13:
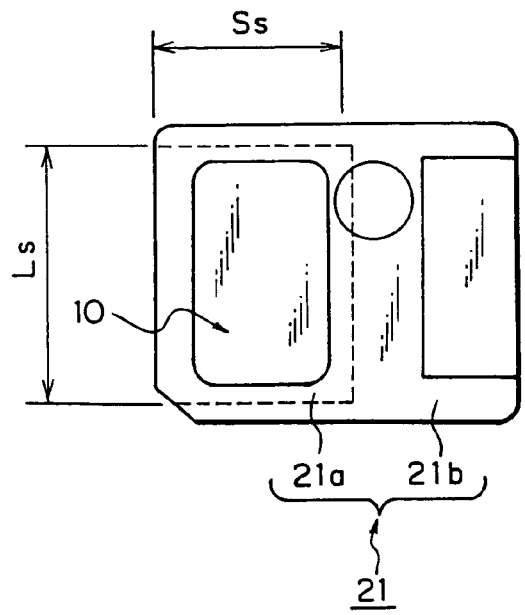
FIG. 13 is a plan view showing another example of the structure of the card type storage apparatus according to the fourth embodiment of the present invention.

In the card type storage apparatus shown in FIG. 13, a support card 21 has a first area 21a and a second area 21b. The first area 21a is formed in a frame shape and surrounds the storage apparatus 10. The second area, 21b is disposed outside the first area 21a. In the card type storage apparatus shown in FIG. 13, the first area 21a is detachable from the second area 21b.

In the example, the support card 21 is formed in a rectangular shape of which the length Ls on the longer side of the first area 21a of the support card is 30.0 mm and the length Ss on the shorter side of the first area 21a of the support card is 23.0 mm.

Figure 14:
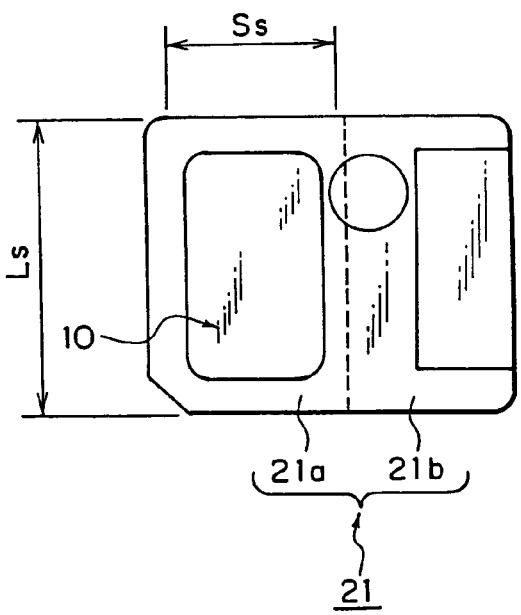
FIG. 14 is a plan view showing another example of the structure of the card type storage apparatus according to the fourth embodiment of the present invention.
Figure 15:
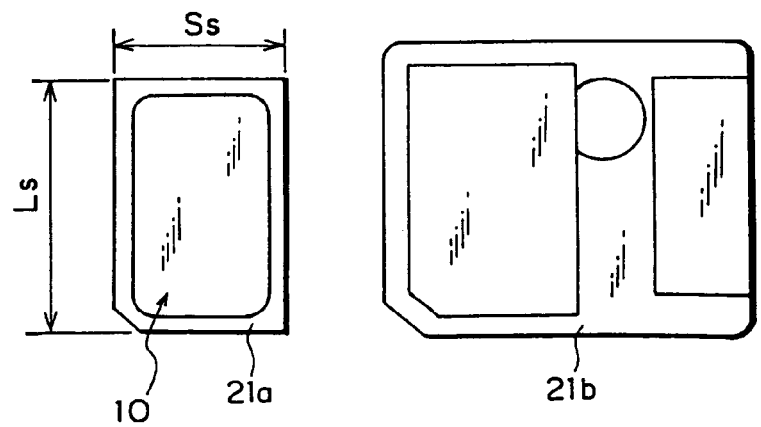
FIG. 15 is a plan view showing the state that the first area is detached from the second area in the example of FIG. 10.
Figure 16:
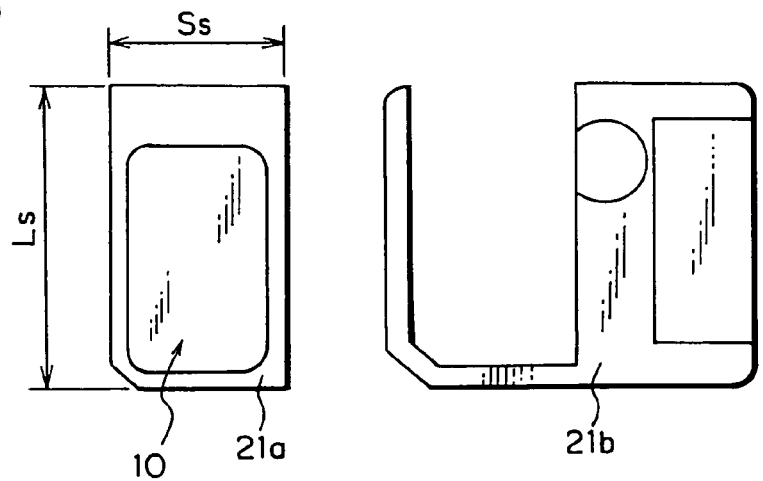
FIG. 16 is a plan view showing the state that the first area is detached from the second area in the example of FIG. 12.
Figure 17:
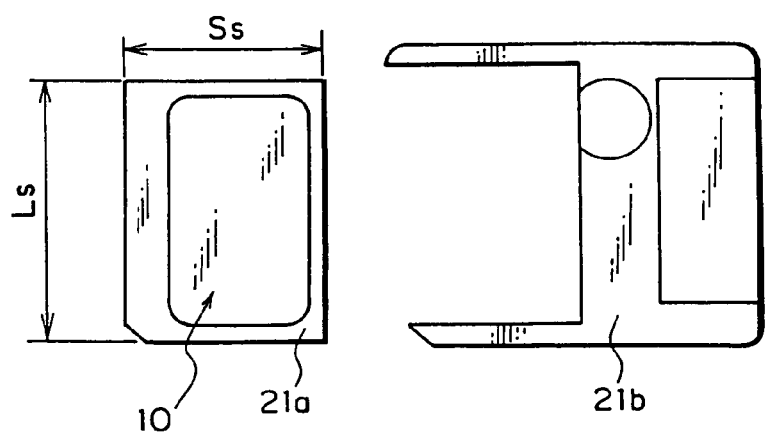
FIG. 17 is a plan view showing the state that the firs t area is detached from the second area in the example of FIG. 13.
Figure 18:
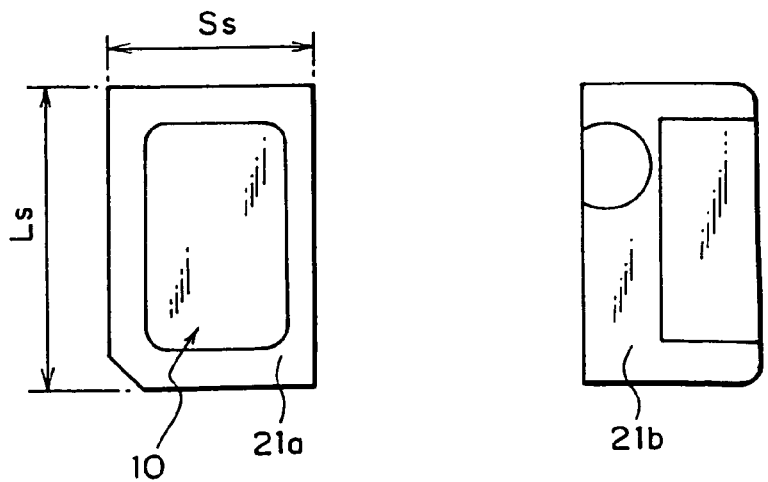
FIG. 18 is a plan view showing the state that the first area is detached from the second area in the example of FIG. 14.

In the card type storage apparatus shown in FIG. 14, a support card 21 has a first area 21a and a second area 21b. The first area 21a is formed in a frame shape and surrounds the storage apparatus 10. The second area 21b is disposed outside the first area 21a. In the card type storage apparatus shown in FIG. 14, the first area 21a is detachable from the second area 21b.

In the example, the support card 21 is formed in a rectangular shape of which the length Ls on the longer side of the first area 21a of the support card is 37.0 mm and the length Ss on the shorter side of the first area 21a of the support card is 25.0 mm.

FIGS. 15, 16, 17, and 18 are plan views showing the state that the first area 21a of the card type storage apparatus is detached from the second area 21b in the examples shown in FIGS. 10, 12, 13, and 14, respectively.

Thus, in the card type storage apparatus according to the present invention, the first area 21a is detachable from the second area 21b. Consequently, the card type storage apparatus can be attached to a host side electronic apparatus that is smaller than the outer size of the support card 21.

The thickness of the card type storage apparatus according to the fourth embodiment is 0.76±0.08 mm. In the card type storage apparatus according to the present invention, the size and thickness thereof can be adjusted when necessary.

Fifth Embodiment

FIG. 20 is a perspective view showing an example of the structure of a detachable card type storage apparatus according to a fifth embodiment of the present invention.

A first area 21a and a second area 21b of a support card have shoulder portions formed on edge surfaces in parallel with the inserting direction of the second area 21b to the first area 21a. The edge surfaces of the first area 21a are fitted to the edge surfaces of the second area 21b. Steps of the shoulder portions of the second area 21b have protrusions 41a. When the protrusions 41a are fitted to holes 41b formed on the steps of the first area 21a, the first area 21a and the second area 21b are integrally secured.

Sixth Embodiment

FIG. 21 is a perspective view showing an example of the structure of a detachable card type storage apparatus according to a sixth embodiment of the present invention.

Edge surfaces in parallel with the inserting direction of a second area 21b of a support card to a first area 21a thereof are formed in a curved shape. The edge surfaces of the first area 21a are matched with the edge surfaces of the second area 21b. When a side surface 21t of the first area 21a is fitted with a side surface 21s of the second area 21b and the first area 21a is inserted in the arrow direction, the first area 21a can be integrally secured with the second area 21b.

Seventh Embodiment

FIGS. 22A, 22B, 22C, and 22D are schematic diagrams showing another example of the structure of a card type storage apparatus according to a seventh embodiment of the present invention.

Figure 22A:
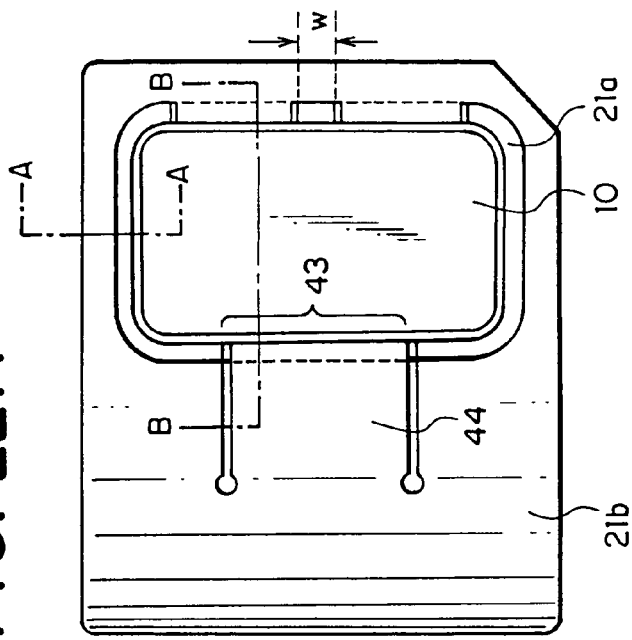
FIG. 22A is a plan view showing an example of the structure of a card type storage apparatus according to a seventh embodiment of the present invention.
Figure 22B:
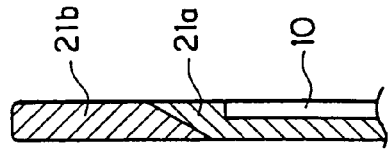
FIG. 22B is a sectional view taken along line A-A shown in FIG. 22A.
Figure 22C:
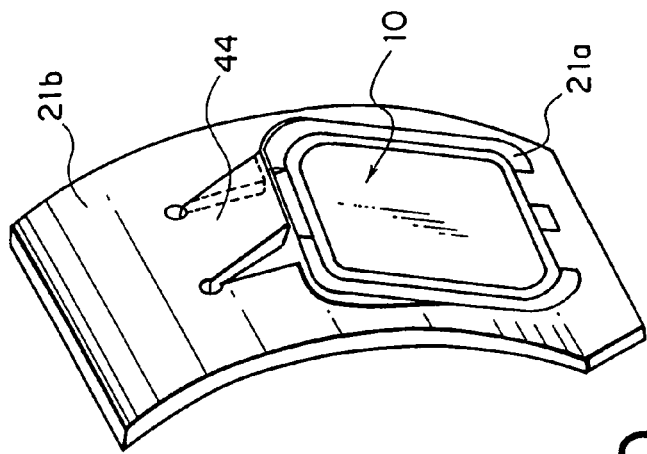
FIG. 22C is a perspective view showing the state that first area 21*a* is attached to a second area 21*b* shown in FIG. 22A.
Figure 22D:
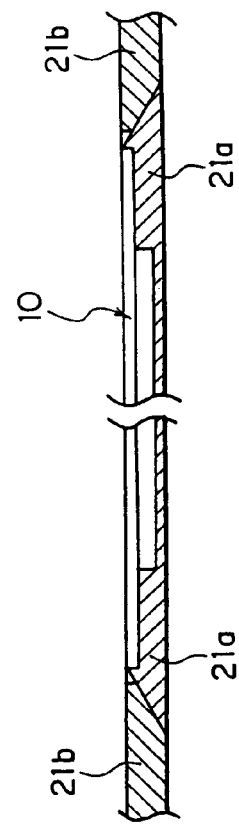
FIG. 22D is a sectional view taken along line B-B shown in FIG. 22A.

FIG. 22A is a plan view showing the structure of the card type storage apparatus according to the seventh embodiment. FIG. 22B is a sectional view taken along line A-A shown in FIG. 22A. FIG. 22C is a perspective view showing the state that a first area 21a is attached to a second area 21b. FIG. 22D is a sectional view taken along line B-B shown in FIG. 22A.

As with the above-described embodiments, the card type storage apparatus according to the seventh embodiment is structured in such a manner that the first area 21a is detachable from the second area 21b. In this example, an edge surface 21t of the first area 21a is tapered. On the other hand, an edge surface 21s of the second area 21b is reversely tapered so that the edge surface 21s of the second area 21b fits the edge surface 21t of the first area 21a. Only an area 43 of the edge surface of the first area 21a is reversely tapered against the other part of the first area. An area corresponding to the area 43 of the second area 21b of the support card has a nail-shaped hinge 44. The hinge 44 is tapered so that it fits the area 43. In other words, the tapering direction of the side surface 21s of the second area 21b is reverse of that of the other portion.

With such a structure, the first area 21a of the card type storage apparatus can be secured with the second area 21b thereof.

With such a structure, in the card type storage apparatus according to the present invention, since the first area 21a is detachable from the second area 21b, the first area 21a can be attached to a host side electronic apparatus smaller than the outer size of the support card.

Eighth Embodiment

Figure 24C:
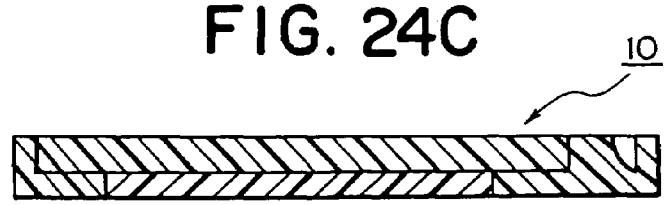
FIG. 24C is a sectional view taken along line C-C shown in FIG. 24A.
Figure 24B:
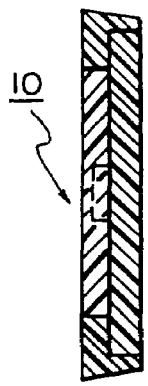
FIG. 24B is a sectional view taken along line B-B shown in FIG. 24A.
Figure 24A:
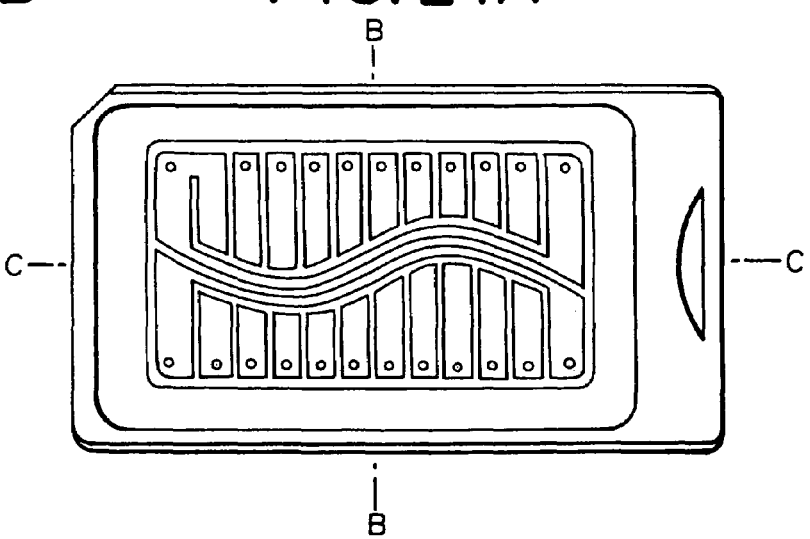
FIG. 24A is a plan view showing another example of the structure of a card type storage apparatus according to the eighth embodiment of the present invention.

FIGS. 23A, 23B, and 23C are schematic diagrams showing the structure of a support card of a card type storage apparatus according to an eighth embodiment of the present invention. FIGS. 24A, 24B, and 24C are schematic diagrams showing the structure of a storage apparatus attached to the support card shown in FIGS. 23A, 23B, and 23C.

FIG. 23A is a plan view showing the structure of the support card. FIG. 23B is a sectional view taken along line A-A shown in FIG. 23A. FIG. 23C is a sectional view showing the structure of a support card according to another embodiment corresponding to FIG. 23B. FIG. 24A is a plan view showing the structure of the storage, apparatus. FIG. 24B is a sectional view taken along line B-B shown in FIG. 24A. FIG. 24C is a sectional view taken along line C-C shown in FIG. 24C.

The support card 50 of the card type storage apparatus has a cut-out portion 51 for detaching a storage apparatus. A bottom portion to which the storage apparatus is attached is composed of a SUS plate 52 that is integrally formed with mold resin. Edge portions of the SUS plate 52 are inwardly bent for 60° so as to form a slide groove. In addition, a resin mold portion connected to the SUS plate 52 is also inwardly bent for 60°.

The length L on the longer side of the support card 50 is around 45.0 mm. The length S on the shorter side of the support card is around 37.0 mm. The width of the inner bottom surface of the SUS plate 52 in the slide groove shape is 19.5 mm. A notch 54 is formed at the rear edge of the storage apparatus 53 of the card type storage apparatus. Both side edges of the storage apparatus 53 are tapered at an angle of around 60° so that the storage apparatus 53 is inserted into a concave portion of the slide groove of the support card 50. The length L on the longer side of the storage apparatus 53 is around 33.5 mm. The length S on the shorter side of the storage apparatus 53 is around 19.0 mm.

Since the storage apparatus 53 is detached from the support card 50 and the only the storage apparatus 53 is attached to a host side electronic apparatus, the electronic apparatus 53 can be compactly structured.

Figure 25A:
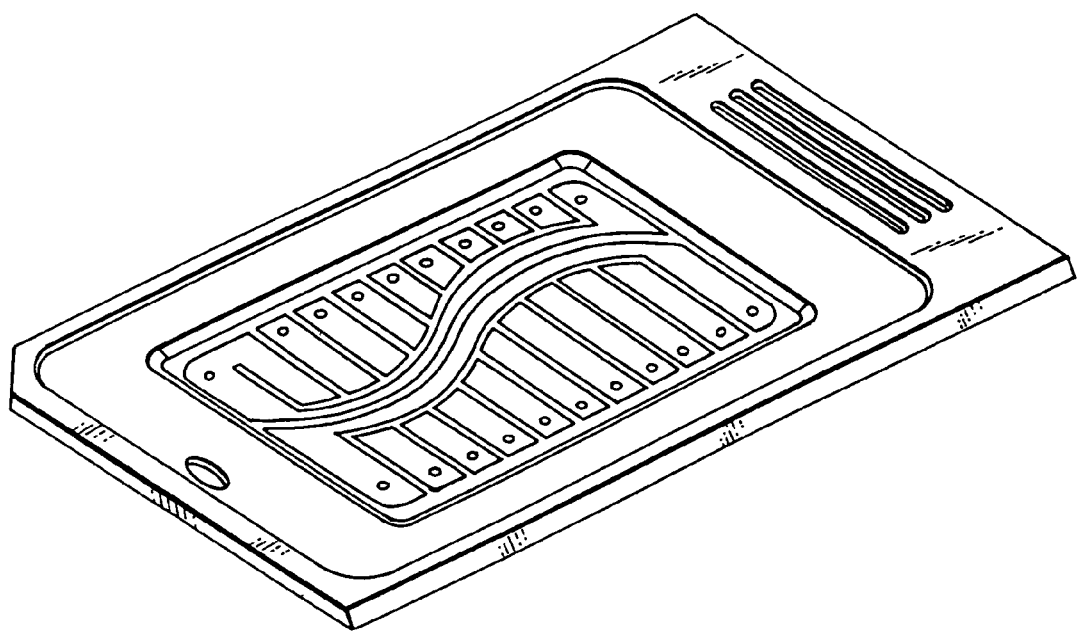
FIG. 25A is a perspective view showing another example of the structure of a storage apparatus of a card type storage apparatus according to the eighth embodiment of the present invention.
Figure 25B:
FIG. 25B is a sectional view taken along line A-A shown in FIG. 25A.

FIGS. 25A and 25B show another example of the structure of the storage apparatus 55 used for the card type storage apparatus according to the present invention.

FIG. 25A is a perspective view showing the storage apparatus. FIG. 25B is a sectional view taken along line A-A of FIG. 25A. The storage apparatus 55 is fitted to a frame member 56 composed of synthetic resin. The storage apparatus 55 and the frame member 56 are integrally adhered with adhesive resin so as to result in a card shape as a whole.

The frame member 56 has a shoulder portion b and a hole portion c. The substrate 55a is fitted to the shoulder portion b. A molding resin portion 55b is fitted to the hole portion c. When the storage apparatus 55 is fitted to the shoulder portion b and the hole portion c, the storage apparatus 55 is formed in a card shape.

Uneven portions 57 are formed on both the front and rear surface of the frame member 56. With the uneven portions 57 the user can easily attach/detach the storage apparatus 56 to/from the frame member 56. In addition, a hole 58 that fits a protrusion of the support card is formed on the frame member 56 so as to secure the storage apparatus 55 to the support card. A peripheral portion of the hole 58 of the frame member 56 is structured so that the hole is fitted to or separate from the protrusion of the support card with a click function.

Further, FIG. 25C shows the state that the storage apparatus 55 of FIG. 25A is inserted into the support card 50.

Ninth Embodiment

Figure 26:
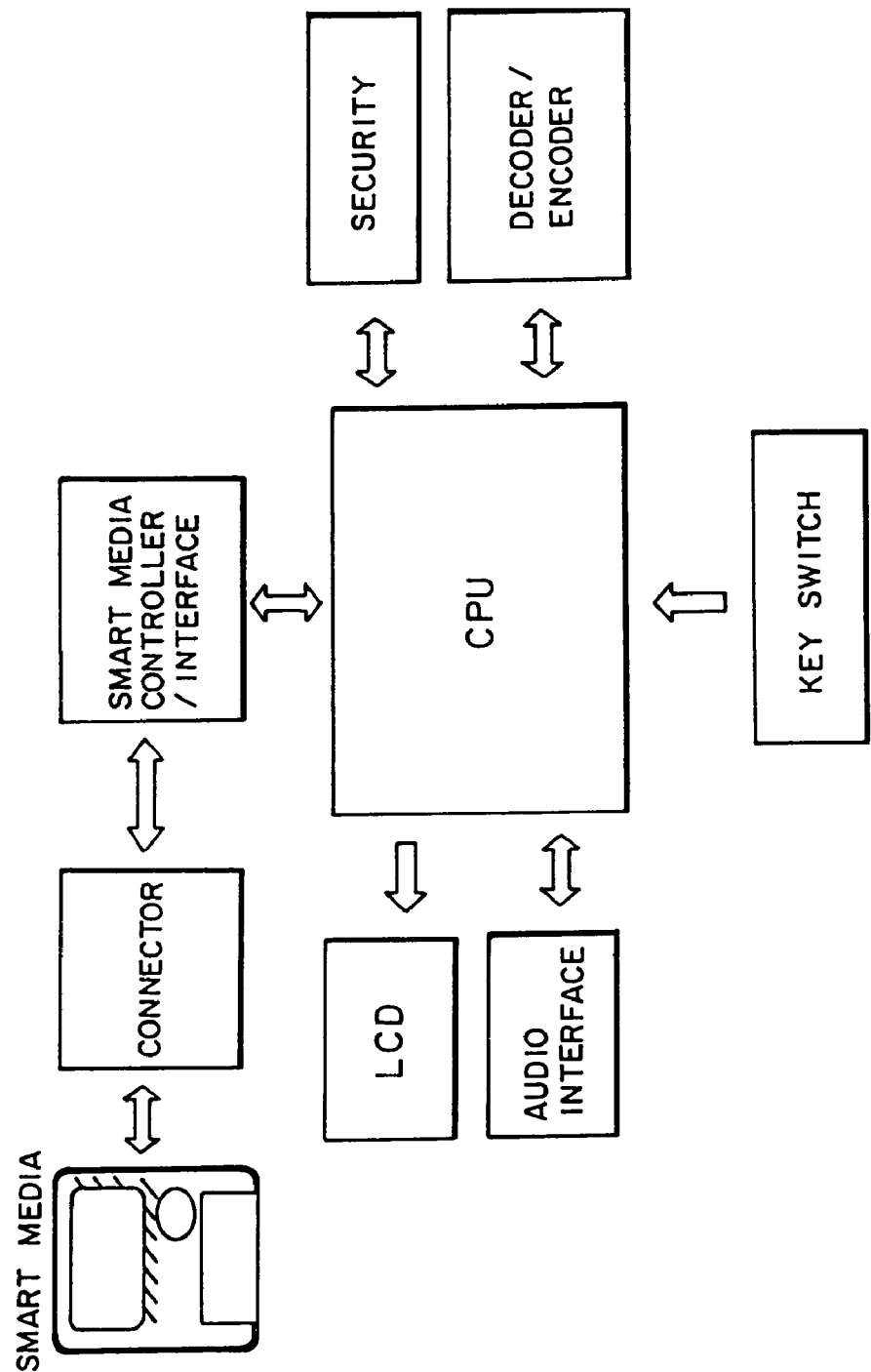
FIG. 26 is a block diagram showing the structure of which a card type storage apparatus according to the present invention is applied to a picture/audio storing medium for a digital audio system.

FIG. 26 is a block diagram showing the structure of which a card type storage apparatus according to the present invention is applied to a picture/audio storage medium of a digital audio system.

The card type storage apparatus (smart medium) according to the present invention is connected to a smart medium controller through a connector. The smart medium controller inputs and outputs picture/audio information through an interface under the control of a CPU.

A digital signal that is read from the smart medium is supplied to a decoder through the CPU. The decoder decodes the digital information into a picture signal or an audio signal. The picture signal is reproduced by an LCD. The audio information is reproduced by an audio unit (not shown) through an audio interface. An input signal is supplied to an encoder. The encoder encodes the input signal into a digital signal. The digital signal is recorded to the smart medium through the interface. When a signal is input/output, when necessary, the signal is encrypted or decrypted.

These operations are performed with for example key switches.

According to the present invention, since the molding resin is unsymmetrically disposed on the wiring substrate, the storage apparatus can be properly attached to the host side unit. Thus, the user-friendliness improves. In addition, the semiconductor apparatus can be prevented from malfunctioning and being damaged.

In the storage apparatus according to the present invention, since the serial access type memory device and the flat type external connection terminal are used in combination, the outer size of the storage apparatus becomes close to the outer size of the memory device. Thus, the storage apparatus according to the present invention is suitable for an external storage apparatus used in a small mobile communication terminal such as a portable telephone unit, a PHS unit, a pocket bell, or a PDA.

In addition, when the serial access type memory device and the flat type external connection terminal are used in combination, the structure of the flat type external connection electrodes of the storage apparatus and the structure of the host side electronic apparatus can be standardized.

In the card type storage apparatus according to the present invention, since the molding resin of the storage apparatus is unsymmetrically fitted to the support card, the storage apparatus can be properly attached to the support card. Thus, the user-friendliness improves. Consequently, the storage apparatus can be prevented from malfunctioning and being damaged.

In the card type storage apparatus according to the present invention, since the support card is separated into a plurality of portions, the storage apparatus can be connected to a host side unit that is smaller than the outer size of the support card.

In the electronic apparatus according to the present invention, the storage apparatus can be properly attached to the electronic apparatus. Thus, when the storage apparatus is connected to a host side electronic apparatus such as a portable telephone unit, a PHS unit, a pocket bell, a PDA, a PC, or a digital camera, the electronic apparatus can be prevented from malfunctioning or being damaged. In addition, the user-friendliness remarkably improves. So far, it was difficult to accomplish an external connecting unit that can be used in common with a portable telephone unit, a PHS unit, a pocket bell, a PDA unit, a digital camera, a note type PC, a PC, and so forth. However, with the storage apparatus and the electronic apparatus according to the present invention, data such as telephone numbers registered to a portable telephone unit and text data, picture data, and so forth received through Internet can be transferred to and shared with other information processing units.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A storage device, comprising:
    a storage apparatus having a thickness of 1.4 mm±0.1 mm, which has a first surface and a second surface, a flat type external connection terminal disposed on the first surface, a flash memory in the storage apparatus, a marker formed on the second surface of the storage apparatus representing an inserting direction of the storage apparatus, and a first set of connection terminals; and
    a supporting frame supporting the storage apparatus having an engaging portion, the engaging portion detachably receiving said storage apparatus, the supporting frame having a second set of connection terminals that electrically engage the first set of connection terminals, and a third set of connection terminals that are connected to the second set of connection terminals,
    wherein said storage apparatus is configured to output data stored in the flash memory through the support frame, and
    wherein signals received on said second set of connection terminals are identical to signals output on said third set of connection terminals.

2. The storage device as set forth in claim 1, wherein said marker represents the Inserting direction being parallel with a long side of the storage apparatus.

3. The storage device as set forth in claim 1, wherein the engaging portion of said supporting frame fits said storage apparatus in such a manner that at least a part of said storage apparatus is exposed.

4. The storage device as set forth in claim 1, wherein a depth of the engaging portion of said supporting frame is larger than a thickness of said storage apparatus.

5. The storage device as set forth in claim 1, wherein the inserting direction represents the inserting direction of the storage apparatus to the concave portion of the supporting frame.

6. The storage device as set forth in claim 1, the support frame having a first portion and a second portion, wherein the storage apparatus is detachable from the first portion, and
    wherein the second portion detachably receives the first portion.

7. The storage device as set forth in claim 6, wherein the engaging portion of the supporting frame is a concave portion of the first portion.

8. The storage device as set forth in claim 1, wherein the storage apparatus is configured to output data stored in the flash memory without using the supporting frame.

* * * * *

UNITED STATES PATENT AND TRADEMARK OFFICE
CERTIFICATE OF CORRECTION

| | | |
|---|---|---|
| PATENT NO. | : 7,489,027 B2 | Page 1 of 1 |
| APPLICATION NO. | : 12/007034 | |
| DATED | : February 10, 2009 | |
| INVENTOR(S) | : Iwasaki | |

It is certified that error appears in the above-identified patent and that said Letters Patent is hereby corrected as shown below:

Claim 2, column 18, line 10, change "Inserting" to --inserting--.

Signed and Sealed this

Thirtieth Day of June, 2009

JOHN DOLL
*Acting Director of the United States Patent and Trademark Office*